(12) United States Patent
Kiyose

(10) Patent No.: US 10,350,639 B2
(45) Date of Patent: Jul. 16, 2019

(54) ULTRASONIC DEVICE, PIEZOELECTRIC DEVICE, ULTRASONIC MEASUREMENT APPARATUS, AND ELECTRONIC INSTRUMENT

(71) Applicant: Seiko Epson Corporation, Tokyo (JP)

(72) Inventor: Kanechika Kiyose, Matsumoto (JP)

(73) Assignee: Seiko Epson Corporation (JP)

( * ) Notice: Subject to any disclaimer, the term of this patent is extended or adjusted under 35 U.S.C. 154(b) by 381 days.

(21) Appl. No.: 15/210,096

(22) Filed: Jul. 14, 2016

(65) Prior Publication Data

US 2017/0028440 A1  Feb. 2, 2017

(30) Foreign Application Priority Data

Jul. 29, 2015 (JP) ................................ 2015-150079

(51) Int. Cl.
   *B06B 1/06* (2006.01)
   *H01L 41/313* (2013.01)
(52) U.S. Cl.
   CPC .......... *B06B 1/0629* (2013.01); *H01L 41/313* (2013.01)
(58) Field of Classification Search
   CPC ... B06B 1/0629; B06B 1/0644; H01L 41/313; B08B 3/12; B08B 7/026
   See application file for complete search history.

(56) References Cited

U.S. PATENT DOCUMENTS

| | | | |
|---|---|---|---|
| 2013/0223191 A1* | 8/2013 | Nakamura | B06B 1/0629 367/135 |
| 2013/0294201 A1* | 11/2013 | Hajati | H01L 41/047 367/138 |
| 2014/0066778 A1* | 3/2014 | Nishiwaki | B06B 1/0215 600/459 |
| 2014/0290371 A1* | 10/2014 | Nakamura | G01N 29/28 73/644 |
| 2015/0092514 A1* | 4/2015 | Kiyose | B06B 1/0629 367/7 |
| 2015/0141827 A1* | 5/2015 | Kiyose | A61B 8/4427 600/443 |
| 2016/0058417 A1* | 3/2016 | Kiyose | G01S 15/8925 600/472 |

FOREIGN PATENT DOCUMENTS

| | | |
|---|---|---|
| JP | 2001-230648 A | 8/2001 |
| JP | 2005-136801 A | 5/2005 |
| JP | 2011-259274 A | 12/2011 |

* cited by examiner

*Primary Examiner* — Bryan P Gordon
(74) *Attorney, Agent, or Firm* — Harness, Dickey & Pierce, P.L.C.

(57) ABSTRACT

An ultrasonic device includes an element substrate provided with an ultrasonic transducer array in which a plurality of ultrasonic transducers are arranged in an array, a sealing plate (array counter plate) that is bonded to the element substrate and covers at least the ultrasonic transducer array, and a support substrate that supports at least one of the element substrate and the sealing plate, and the support substrate has a through hole (insertion section) into which at least part of the sealing plate is inserted.

13 Claims, 19 Drawing Sheets

ULTRASONIC DEVICE, PIEZOELECTRIC DEVICE, ULTRASONIC MEASUREMENT APPARATUS, AND ELECTRONIC INSTRUMENT

BACKGROUND

1. Technical Field

The present invention relates to an ultrasonic device, a piezoelectric device, an ultrasonic measurement apparatus, and an electronic instrument.

2. Related Art

There is a known ultrasonic probe of related art including an ultrasonic transmitter that transmits and receives an ultrasonic wave, and the ultrasonic transmitter is electrically connected to a signal processing circuit section via a plate-shaped backing material layer, transmits an ultrasonic wave in accordance with a transmission pulse signal from the signal processing circuit section, and outputs a reception pulse signal to the signal processing circuit section in accordance with a received ultrasonic wave (see JP-A-2011-259274, for example).

The ultrasonic transmitter described in JP-A-2011-259274 includes a diaphragm and a support member that is disposed on the ultrasonic wave radiation side of the diaphragm and supports the diaphragm. The diaphragm, which is one of the components that form the ultrasonic transmitter, includes a thin-plate-shaped base material layer and a drive layer that serves as an electromechanical conversion element and is provided on the surface of the base material layer on the side opposite the support member (rear surface of base material layer). A through silicon via (TSV) substrate (sealing member) is provided on the rear surface side of the base material layer, and the TSV substrate covers the drive layer. Through electrodes provided in the TSV substrate are connected to the signal processing circuit section via the backing material layer in such a way that electricity can be conducted through the through electrodes. The diaphragm is thus fixed to the backing material layer and other components with the diaphragm supported by the sealing member, as described above.

In the ultrasonic probe (ultrasonic module) described in JP-A-2011-259274, however, the diaphragm provided with the drive layer is fixed to the signal processing circuit section, that is, a circuit substrate via the TSV substrate (sealing plate) and the backing material layer, resulting in a problem of an increase in the thickness dimension in the direction in which the diaphragm, the sealing plate, the backing material layer, and the circuit substrate are arranged and hence an increase in the size of the ultrasonic module.

To address the problem, it is conceivable to reduce the thickness dimension of the sealing member so as to suppress the increase in the size of the ultrasonic probe. In this case, however, since the rigidity of the sealing plate decreases, stress produced when the ultrasonic probe is brought into contact with a measurement target could undesirably deform or break the sealing plate and the diaphragm. The degree of the reduction in the thickness dimension of the sealing plate is therefore limited because the rigidity of the sealing plate needs to be ensured, and it is therefore difficult to reduce the size of the ultrasonic module with desired rigidity ensured.

SUMMARY

An advantage of some aspects of the invention is to provide an ultrasonic device, a piezoelectric device, an ultrasonic measurement apparatus, and an electronic instrument having desired rigidity and a compact size.

An ultrasonic device according to an application example of the invention includes an element substrate provided with an ultrasonic transducer array in which a plurality of ultrasonic transducers are arranged in an array, an array counter plate that is bonded to the element substrate and covers at least the ultrasonic transducer array, and a support substrate that supports at least one of the element substrate and the array counter plate, and the support substrate has an insertion section into which at least part of the array counter plate is inserted.

In this application example, in the state in which at least part of the array counter plate is inserted into the insertion section, the support substrate supports at least one of the element substrate and the array counter plate.

In this configuration, the thickness dimension of the ultrasonic device can be reduced by the thickness dimension of at least the part of the array counter plate inserted into the insertion section, as compared with the thickness dimension of an ultrasonic device having the configuration of related art in which a support substrate, an array counter plate, and an element substrate each having a predetermined thickness dimension are sequentially layered on each other in the substrate thickness direction, whereby the size of the ultrasonic device can be reduced. Further, it is not necessary to reduce the dimension of the array counter plate in order to reduce the size of the ultrasonic device, whereby a decrease in the rigidity of the array counter plate can be avoided. As described above, according to the present application example, an ultrasonic device having desired rigidity and a compact size can be provided.

It is preferable that the ultrasonic device according to the application example further includes a fixing member that fixes the array counter plate to the support substrate.

As the fixing member, for example, a resin material, such as a variety of adhesives, can be used.

In the application example with this configuration, the fixing member fixes the array counter plate to the support substrate. That is, the array counter plate inserted into the insertion section is fixed to the support substrate. As a result, for example, even when force in the direction parallel to the substrate thickness direction acts on the ultrasonic device, for example, at the time of measurement, deformation of the element substrate due to movement of the array counter plate in the insertion section and breakage of the element substrate due to the deformation the amount of which exceeds an allowable range can be avoided.

In the ultrasonic device according to the application example, it is preferable that the insertion section is a first groove section provided in a thickness direction of the support substrate, and that the first groove section has a first bottom surface that comes into contact with a surface of the array counter plate, the surface facing aside opposite the element substrate.

In the application example with this configuration, the insertion section is a first groove section provided in the thickness direction of the support substrate, and the first bottom surface of the first groove section has comes into contact with a surface of the array counter plate, the surface facing the side opposite the element substrate. In the configuration described above, in the state in which the array counter plate is in contact with the first bottom surface, at least one of the element substrate and the array counter plate can be supported by the support substrate. As a result, the array counter plate and the element substrate can be positioned with respect to the support substrate. That is, since the amount of insertion of the array counter plate can be set by the dimension of the first groove section in the thickness direction, the element substrate can be positioned in a desired position with respect to the support substrate, and the positioning can be readily performed.

In the ultrasonic device according to the application example, the insertion section is preferably a through hole that passes through the support substrate in a thickness direction.

In the application example with this configuration, the insertion section is so provided as to pass through the support substrate. In this configuration, even when the array counter plate has a thickness greater than or equal to the thickness dimension of the support substrate, the array counter plate can be inserted into the insertion section by a desired amount of insertion. That is, the position of the element substrate can be set irrespective of the thickness dimension of the array counter plate, whereby the ultrasonic device can be designed with increased flexibility. For example, bonding the element substrate to the support substrate with the support substrate placed on a flat surface achieves an arrangement in which the end surface of the array counter plate on the side opposite the element substrate and one surface of the support substrate are flush with each other in the thickness direction.

It is preferable that the ultrasonic device according to the application example further includes a reinforcing plate that covers the through hole and is bonded to the support substrate, and a surface of the reinforcing plate facing the through hole comes into contact with a surface of the array counter plate, the surface facing a side opposite the element substrate.

In the application example with this configuration, the reinforcing plate is so bonded to the support substrate as to cover the through hole, and a surface of the reinforcing plate, the surface facing the through hole, comes into contact with a surface of the array counter plate, the surface facing the side opposite the element substrate. In this configuration, in the state in which the array counter plate is in contact with the reinforcing plate, at least one of the element substrate and the array counter plate can be supported by the support substrate. As a result, the array counter plate and the element substrate can be positioned with respect to the support substrate in a desired position in the substrate thickness direction. Further, the reinforcing plate can reinforce the support substrate, and the strength of the ultrasonic device can be improved.

In the ultrasonic device according to the application example, it is preferable that the reinforcing plate has a second groove section which is located in a position where the reinforcing plate overlaps with the array counter plate in a plan view of the reinforcing plate viewed in a thickness direction thereof and into which an end section of the array counter plate, the end section facing the side opposite the element substrate, is inserted, and that the second groove section has a second bottom surface that comes into contact with the surface of the array counter plate on the side opposite the element substrate.

In the application example with this configuration, the end section of the array counter plate on the side opposite the element substrate protrudes from the support substrate in the thickness direction and is inserted into the second groove section provided in the reinforcing plate. Further, in the state in which the surface of the array counter plate on the side opposite the element substrate is in contact with the second bottom surface of the second groove section, at least one of the element substrate and the array counter plate can be supported by the support substrate. As a result, the array counter plate and the element substrate can be positioned with respect to the support substrate in a desired position in the substrate thickness direction, as in the application example described above. In addition to this, the amount of insertion of the array counter plate can be set by the dimension of the second groove section in the thickness direction, whereby the ultrasonic device can be designed with further increased flexibility. Further, setting the planar shape of the second groove section (the shape in a plan view viewed in the plate thickness direction of the reinforcing plate) to be a shape according to the planar shape of the array counter plate allows alignment of the array counter plate to be suitably performed and positional shift of the array counter plate in the plane direction to be suppressed.

In the ultrasonic device according to the application example, it is preferable that the element substrate has a protruding section that protrudes beyond the array counter plate and the insertion section in a plan view viewed along a substrate thickness direction, and that the protruding section is bonded to the support substrate.

In the application example with this configuration, the protruding section of the element substrate is bonded to the support substrate with the array counter plate inserted into the insertion section. In this configuration, in the state in which the array counter plate is inserted into the insertion section, the position of the element substrate relative to the support substrate in the plan view can be readily adjusted, whereby the positioning accuracy can be improved.

It is preferable that the ultrasonic device according to the application example preferably further includes bonding members that bond the element substrate to the support substrate, that the element substrate has a first surface and a second surface facing away from the first surface, that the ultrasonic transducer array is provided on the first surface, that the array counter plate is bonded to the first surface, that the first surface of the protruding section of the element substrate has element terminal sections electrically connected to the ultrasonic transducers, that the support substrate has circuit terminal sections provided in positions facing the element terminal sections and electrically bonded to the element terminal sections, and that the bonding members are made of an electrically conductive material and electrically bond the element terminal sections to the circuit terminal sections.

In the application example with this configuration, the bonding members are made of an electrically conductive material and directly bond the element terminal sections provided on the element substrate to the circuit terminal sections provided on the support substrate so that the element substrate is bonded to the support substrate (what is called face-down implementation). As a result, work steps in the implementation of the ultrasonic device can be simplified, whereby the manufacturing efficiency can be improved. Further, in the implementation, when the element terminal sections and the circuit terminal sections are bonded to a flexible printed circuit by using solder, the flexible printed circuit is heated twice, that is, one end side of the flexible printed circuit is heated and the other end side thereof is then heated, resulting in an increase in the number of heating steps. In this case, by the time of the second heating, a resin material (resin coating, adhesive, or any other component that covers circuit terminal sections) placed in an ultrasonic module is thermally shrunk or deformed, possibly resulting in stress acting on the element substrate and deformation of the element substrate. In contrast, in the present application example, the face-down implementation allows the element terminal sections to be bonded to the circuit terminal sections in single heating operation, whereby the deformation of the element substrate described above can be suppressed.

In the ultrasonic device according to the application example, it is preferable that the element substrate has opening sections corresponding to the plurality of ultrasonic transducers and vibration films that close the opening sections, and that the array counter plate has recessed sections provided in positions where the recessed sections overlap with the vibration films corresponding to the ultrasonic transducers in a plan view viewed in a thickness direction of the element substrate and barrier sections that separate the recessed sections from each other and support the element substrate in regions between the plurality of ultrasonic transducers and other than the vibration films.

In the application example with this configuration, the array counter plate has the recessed sections, which are provided in the positions where the recessed sections overlap with the ultrasonic transducers, and the barrier sections, which separate the recessed sections from each other and support the element substrate, specifically, the regions between the ultrasonic transducers and other than the regions where the vibration films are formed. In the configuration described above, since the recessed sections corresponding to the ultrasonic transducers are separated from each other by the barrier sections, crosstalk between the ultrasonic transducers can be suppressed. Further, since the barrier sections support the element substrate, bending of the element substrate can be suppressed.

In the ultrasonic device according to the application example, it is preferable that the element substrate has opening sections corresponding to the plurality of ultrasonic transducers and vibration films that close the opening sections, that the ultrasonic transducer array has ultrasonic transducer groups each including a plurality of the ultrasonic transducers driven with a single drive signal and arranged adjacent to each other, and that the array counter plate has recessed sections open toward the element substrate and provided in positions where the recessed sections overlap with the vibration films corresponding to the ultrasonic transducers, which are contained in the plurality of ultrasonic transducer groups, in a plan view viewed in a thickness direction of the element substrate and barrier sections that separate the recessed sections from each other and support the element substrate in regions between the plurality of ultrasonic transducer groups and other than the vibration films.

In the application example with this configuration, the array counter plate has the recessed sections, which are provided in the positions where the recessed sections overlap with the ultrasonic transducer groups, and the barrier sections, which separate the recessed sections from each other and support the element substrate, specifically, the regions between the ultrasonic transducer groups and other than the regions where the vibration films are formed. In the configuration described above, since the recessed sections corresponding to the ultrasonic transducer groups are separated from each other by the barrier sections, crosstalk between the ultrasonic transducer groups can be suppressed. Further, since the barrier sections support the element substrate, bending of the element substrate can be suppressed.

A piezoelectric device according to this application example of the invention includes an element substrate provided with a piezoelectric element array in which a plurality of piezoelectric elements are arranged in an array, an array counter plate that is bonded to the element substrate and covers at least the piezoelectric element array, and a support substrate that supports at least one of the element substrate and the array counter plate, and the support substrate has an insertion section into which at least part of the array counter plate is inserted.

In this application example, in the state in which at least part of the array counter plate is inserted into the insertion section, the support substrate supports at least one of the element substrate and the array counter plate.

In this configuration, the thickness dimension of the piezoelectric device can be reduced by the thickness dimension of at least the part of the array counter plate inserted into the insertion section, as compared with the thickness dimension of a piezoelectric device having the configuration of related art in which a support substrate, an array counter plate, and an element substrate each having a predetermined thickness dimension are sequentially layered on each other in the substrate thickness direction, whereby the size of the piezoelectric device can be reduced. Further, it is not necessary to reduce the dimension of the array counter plate in order to reduce the size of the piezoelectric device, whereby a decrease in the rigidity of the array counter plate can be avoided. As described above, according to the present application example, a piezoelectric device having desired rigidity and a compact size can be provided.

An ultrasonic measurement apparatus according to this application example of the invention includes an element substrate provided with an ultrasonic transducer array in which a plurality of ultrasonic transducers are arranged in an array, an array counter plate that is bonded to the element substrate and covers at least the ultrasonic transducer array, a support substrate that supports at least one of the element substrate and the array counter plate, and a control section that controls the ultrasonic transducers, and the support substrate has an insertion section into which at least part of the array counter plate is inserted.

In this application example, in the state in which at least part of the array counter plate is inserted into the insertion section, the support substrate supports at least one of the element substrate and the array counter plate.

In this configuration, the thickness dimension of the ultrasonic measurement apparatus can be reduced by the thickness dimension of at least the part of the array counter plate inserted into the insertion section, as compared with the thickness dimension of an ultrasonic measurement apparatus having the configuration of related art in which a support substrate, an array counter plate, and an element substrate each having a predetermined thickness dimension are sequentially layered on each other in the substrate thickness direction, whereby the size of the ultrasonic measurement apparatus can be reduced. Further, it is not necessary to reduce the dimension of the array counter plate in order to reduce the size of the ultrasonic measurement apparatus, whereby a decrease in the rigidity of the array counter plate can be avoided. As described above, according to the present application example, an ultrasonic measurement apparatus having desired strength and a compact size can be provided.

An electronic instrument according to this application example of the invention includes an element substrate provided with a piezoelectric element array in which a plurality of piezoelectric elements are arranged in an array, an array counter plate that is bonded to the element substrate and covers at least the piezoelectric element array, a support substrate that supports at least one of the element substrate and the array counter plate, and a control section that controls the piezoelectric elements, and the support substrate has an insertion section into which at least part of the array counter plate is inserted.

In this application example, in the state in which at least part of the array counter plate is inserted into the insertion section, the support substrate supports at least one of the element substrate and the array counter plate.

In this configuration, the thickness dimension of the electronic instrument can be reduced by the thickness dimension of at least the part of the array counter plate inserted into the insertion section, as compared with the thickness dimension of an electronic instrument having the configuration of related art in which a support substrate, an array counter plate, and an element substrate each having a predetermined thickness dimension are sequentially layered on each other in the substrate thickness direction, whereby the size of the electronic instrument can be reduced. Further, it is not necessary to reduce the dimension of the array counter plate in order to reduce the size of the electronic instrument, whereby a decrease in the rigidity of the array counter plate can be avoided. As described above, according to the present application example, an electronic instrument having desired strength and a compact size can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

An ultrasonic measurement apparatus as an electronic instrument according to a first embodiment of the invention will be described below with reference to the drawings.
Configuration of Ultrasonic Measurement Apparatus 1

Figure 1:
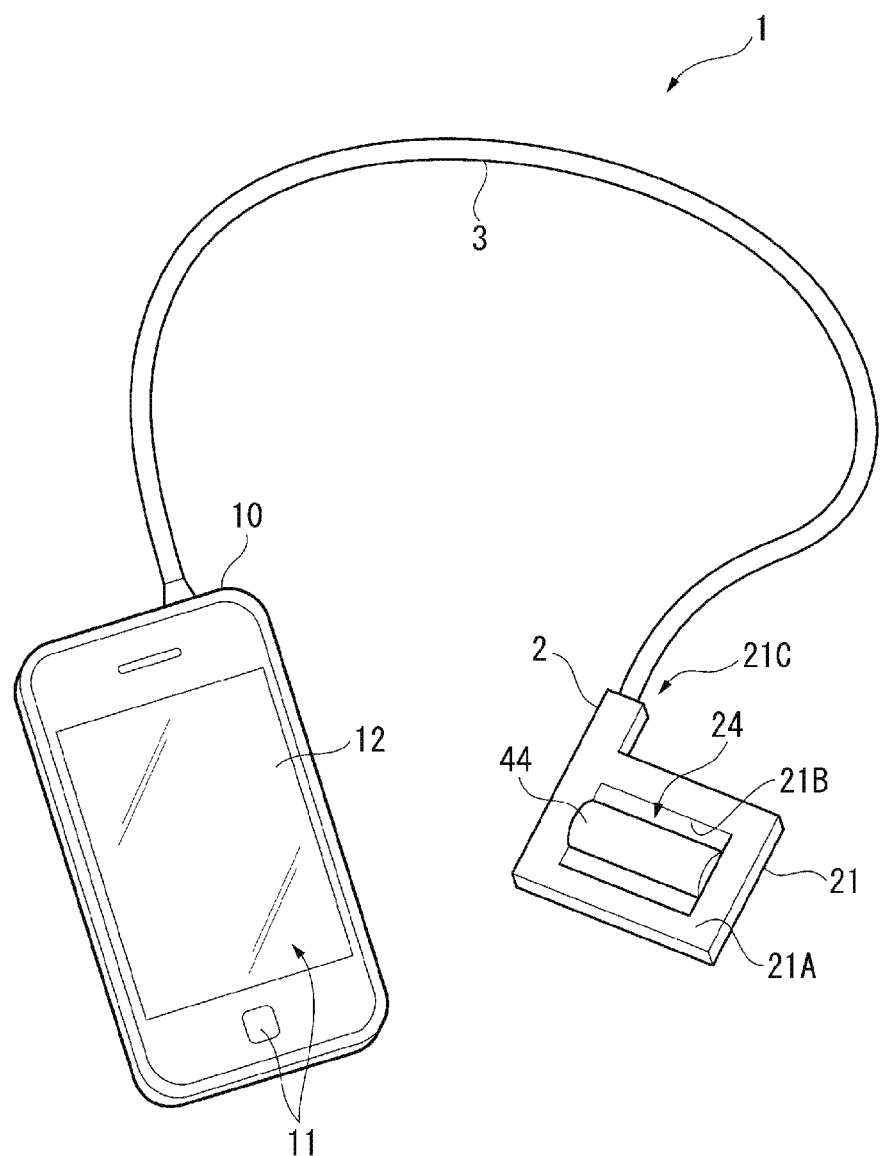
FIG. 1 is a perspective view showing a schematic configuration of an ultrasonic measurement apparatus according to a first embodiment.
Figure 2:
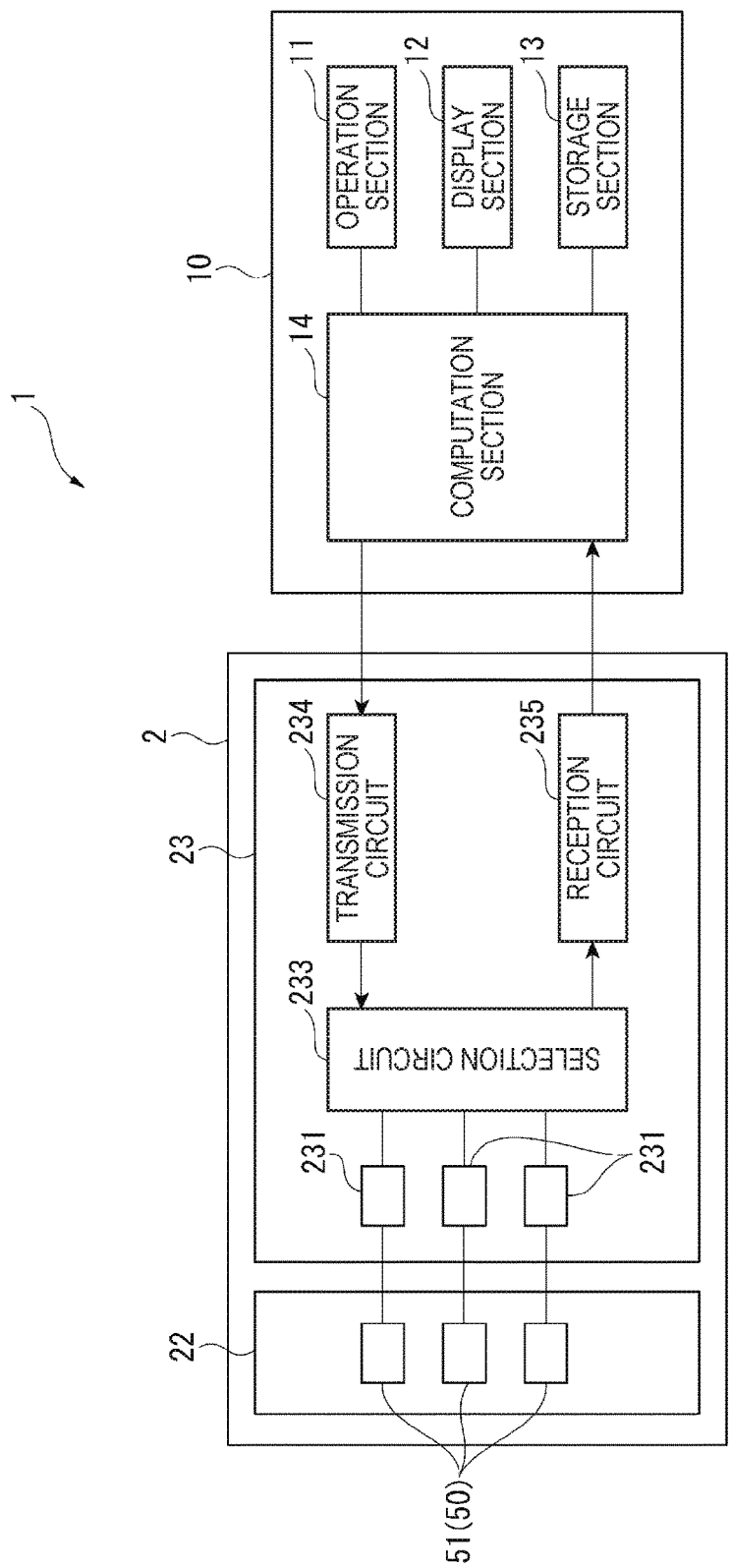
FIG. 2 is a block diagram showing the schematic configuration of the ultrasonic measurement apparatus according to the first embodiment.

FIG. 1 is a perspective view showing a schematic configuration of an ultrasonic measurement apparatus 1 according to the present embodiment. FIG. 2 is a block diagram showing the schematic configuration of the ultrasonic measurement apparatus 1.

The ultrasonic measurement apparatus 1 according to the present embodiment includes an ultrasonic probe 2 and a controller 10, which is electrically connected to the ultrasonic probe 2 via a cable 3, as shown in FIG. 1. The controller 10 corresponds to the control section according to the invention.

The ultrasonic measurement apparatus 1 is so configured that the ultrasonic probe 2 is brought into contact with a surface of a living body (human body, for example) and caused to transmit an ultrasonic wave into the living body. Further, the ultrasonic probe 2 receives the ultrasonic wave reflected off an organ in the living body, and, for example, an internal tomographic image in the living body is acquired and the state (blood flow, for example) of the organ in the living body is measured on the basis of the received signal.
Configuration of Ultrasonic Probe 2

Figure 3:
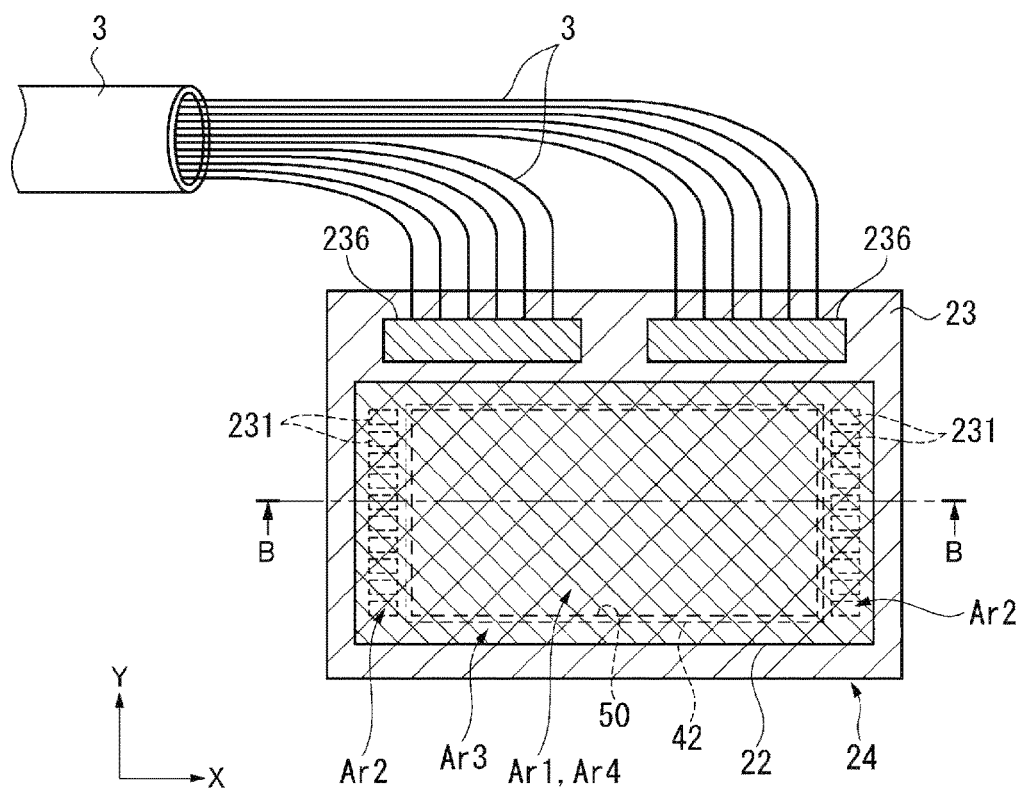
FIG. 3 is a plan view showing a schematic configuration of an ultrasonic device in an ultrasonic probe according to the first embodiment.

FIG. 3 is a plan view showing a schematic configuration of an ultrasonic device 24 in the ultrasonic probe 2.

The ultrasonic probe 2 includes an enclosure 21, an ultrasonic unit 22, which is provided in the enclosure 21, and a wiring substrate 23, on which a driver circuit and other components for controlling the ultrasonic unit 22 are provided and which supports the ultrasonic unit 22.

Figure 5:
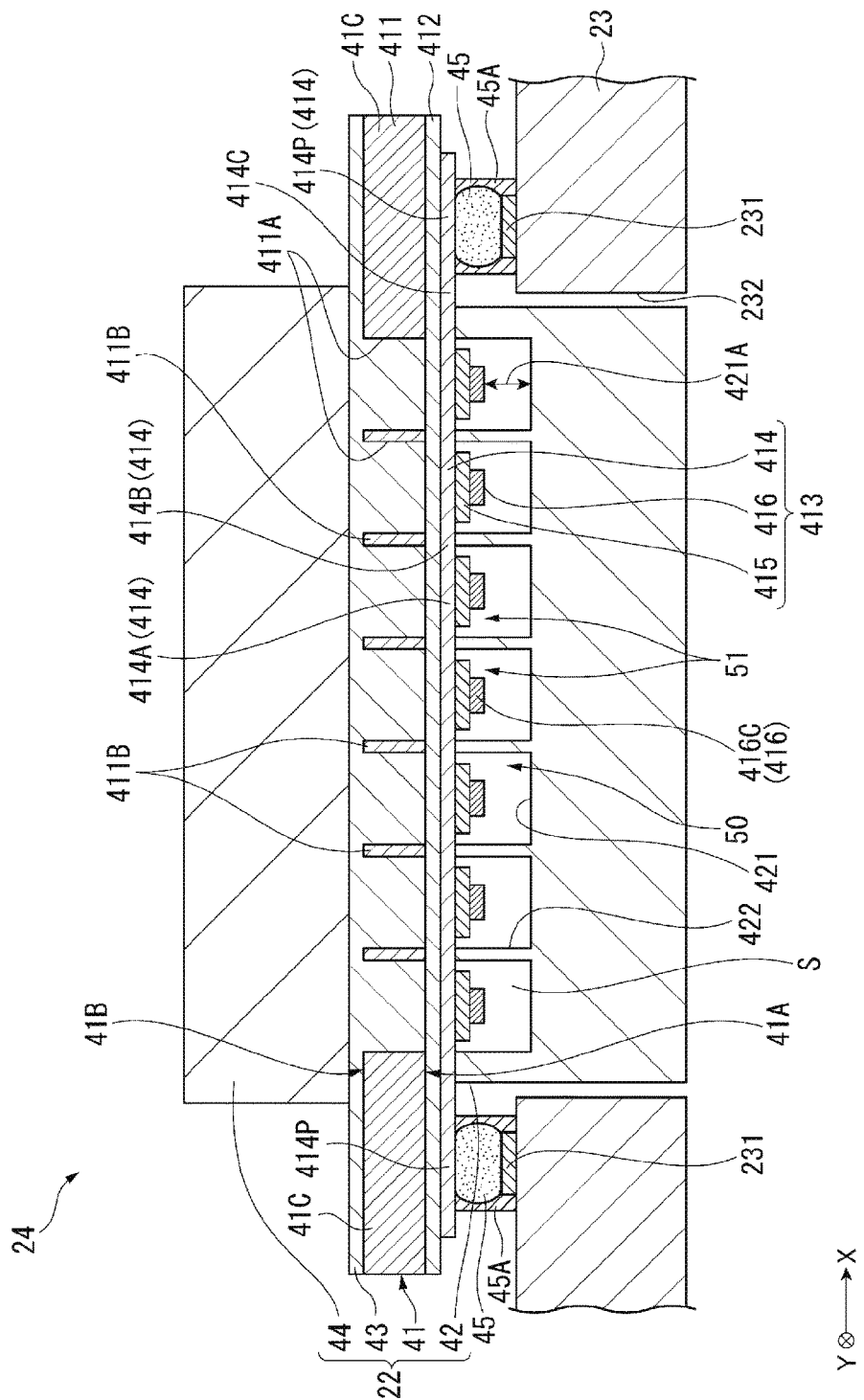
FIG. 5 is a cross-sectional view of the ultrasonic device according to the first embodiment.

The ultrasonic device 24 is formed of the ultrasonic unit 22 and the wiring substrate 23, and the ultrasonic unit 22 and the wiring substrate 23 are boned to each other via bonding members 45 (see FIG. 5). The ultrasonic unit 22 is an example of the piezoelectric device according to the invention and includes piezoelectric elements 413, as will be described later.

The enclosure 21 is formed in a box-like rectangular shape in a plan view and has a sensor window 21B provided in one surface perpendicular to the thickness direction (sensor surface 21A), and part of the ultrasonic unit 22 is exposed through the sensor window 21B, as shown in FIG. 1. A passage hole 21C, through which the cable 3 passes, is provided in part of the enclosure 21 (side surface in the example shown in FIG. 1), and the cable 3 is connected through the passage hole 21C to the wiring substrate 23 in the enclosure 21. The gap between the cable 3 and the passage hole 21C is filled, for example, with a resin material for waterproofness.

In the present embodiment, the configuration in which the ultrasonic probe 2 is connected to the controller 10 by use of the cable 3 is shown by way of example, but the cable connection is not necessarily employed, and the ultrasonic probe 2 may, for example, be connected to the controller 10 in wireless communication, or a variety of configurations of the controller 10 may be provided in the ultrasonic probe 2.

Configuration of Ultrasonic Unit 22

Figure 4:
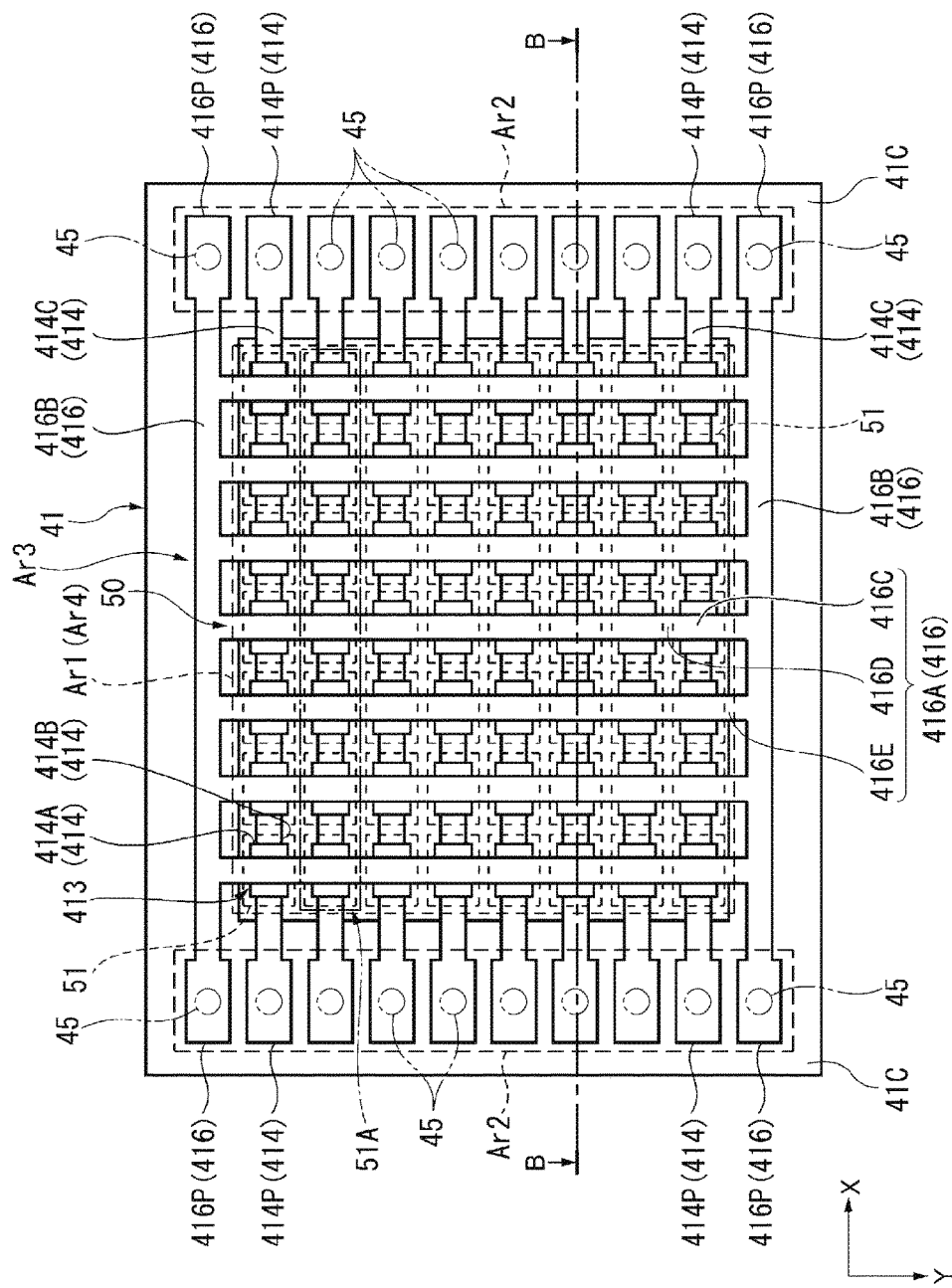
FIG. 4 is a plan view of an element substrate in an ultrasonic device according to the first embodiment viewed from the side facing a sealing plate.

FIG. 4 is a plan view of an element substrate 41 in the ultrasonic unit 22 viewed from the side facing a sealing plate 42. FIG. 5 is a cross-sectional view of the ultrasonic device 24 taken along the line B-B in FIG. 4.

The ultrasonic unit 22, which forms the ultrasonic device 24, includes an element substrate 41, a sealing plate 42, an acoustic matching layer 43 (see FIG. 5), and an acoustic lens 44 (see FIG. 5), as shown in FIGS. 3 and 4.

Configuration of Element Substrate 41

The element substrate 41 includes a substrate main body 411, vibration films 412, which is layered on the substrate main body 411, and the piezoelectric elements 413, which are layered on the vibration films 412, as shown in FIG. 5. The element substrate 41 has a rear surface 41A, which faces the sealing plate 42 and is the first surface in the invention, and an actuation surface 41B, which faces away from the rear surface 41A and is the second surface in the invention. The vibration films 412 and the piezoelectric elements 413 form ultrasonic transducers 51 according to the invention.

In a plan view viewed along the thickness direction of the element substrate 41, an ultrasonic transducer array (piezoelectric element array) 50, in which a plurality of ultrasonic transducers 51 are arranged in an array, is provided in a central area of the element substrate 41, as shown in FIG. 4. The area where the ultrasonic transducer array 50 is provided is hereinafter referred to as an array area Ar1. The sealing plate 42 is arranged on the side facing the rear surface 41A of the element substrate 41 and in a position where the sealing plate 42 overlaps with at least the array area Ar1. The arrangement will be described later.

The element substrate 41 has protruding sections 41C, which protrude toward opposite sides in an X direction beyond the sealing plate 42, which is so disposed as to overlap with the array area Ar1, as shown in FIG. 5. A plurality of first electrode pads 414P and second electrode pads 416P, which are arranged in a Y direction, are provided in terminal areas Ar2 on the rear surface 41A of the protruding sections 41C. The first electrode pads 414P and the second electrode pads 416P correspond to the element terminal sections according to the invention. The element substrate 41, specifically, the protruding sections 41C are bonded to the wiring substrate 23 via the bonding members 45 (the positions where the bonding members 45 are disposed are indicated by the two-dot chain lines in FIG. 4).

The substrate main body 411 is a semiconductor substrate made, for example, of Si. Opening sections 411A, which correspond to the ultrasonic transducer 51, are provided in the array area Ar1 of the substrate main body 411. The opening sections 411A are closed by the vibration films 412, which are provided on the rear surface 41A of the substrate main body 411.

The vibration films 412 are, for example, made of $SiO_2$ or formed of a laminate made of $SiO_2$ and $ZrO_2$ and so provided as to cover the entire rear surface 41A of the substrate main body 411. The thickness dimension of the vibration films 412 is sufficiently smaller than the thickness dimension of the substrate main body 411. When the substrate main body 411 is made of Si and the vibration films 412 are made of $SiO_2$, for example, oxidizing the rear surface 41A of the substrate main body 411 allows vibration films 412 having a desired thickness dimension to be readily formed. In this case, etching the substrate main body 411 by using the vibration films 412 made of $SiO_2$ as an etching stopper allows the opening sections 411A to be readily formed.

The piezoelectric elements 413, each of which is a laminate of a lower electrode 414, a piezoelectric film 415, and an upper electrode 416, are provided on the vibration films 412, which close the opening sections 411A, as shown in FIG. 5. The vibration films 412 and the piezoelectric elements 413 form the ultrasonic transducers 51 according to the invention.

The thus formed ultrasonic transducers 51 can cause the vibration films 412 in opening areas of the opening sections 411A to vibrate and transmit an ultrasonic wave when a predetermined-frequency rectangular-waveform voltage is applied between the lower electrode 414 and the upper electrode 416. When the ultrasonic wave reflected off a target causes the vibration films 412 to vibrate, a potential difference is produced between the upper and lower surfaces of each of the piezoelectric films 415. Detection of the potential difference produced between the lower electrode 414 and the upper electrode 416 therefore allows detection of the received ultrasonic wave.

In the present embodiment, the plurality of ultrasonic transducers 51 described above are arranged in the array area Ar1 of the element substrate 41 along the X direction and the Y direction perpendicular to the X direction, as shown in FIG. 4.

The lower electrode 414 is formed linearly along the X direction. That is, the lower electrode 414 is so provided as to extend across a plurality of ultrasonic transducers 51 arranged along the X direction and is formed of lower electrode main bodies 414A, which are located between the piezoelectric films 415 and the vibration films 412, lower electrode lines 414B, which link adjacent ones of the lower electrode main bodies 414A, and lower terminal electrode lines 414C, which are drawn to the terminal areas Ar2 outside the array area Ar1. Therefore, in the ultrasonic transducers 51 arranged along the X direction, the lower electrode 414 is kept at the same potential.

The lower terminal lines 414C extend to the terminal areas Ar2 outside the array area Ar1 and form the first electrode pads 414P, which are connected to wiring terminal sections 231, which will be described later, in the terminal areas Ar2.

On the other hand, the upper electrode 416 has element electrode sections 416A, each of which is so provided as to extend across a plurality of ultrasonic transducers 51 arranged along the Y direction, common electrode sections 416B (which form part of the second electrode line according to the invention), which link the ends of the element electrode sections 416A, which are parallel to one another, with one another. Each of the element electrode sections 416A has upper electrode main bodies 416C, which are layered on the piezoelectric films 415, upper electrode lines 416D (which form part of the second electrode line according to the invention), which link adjacent ones of the upper electrode main bodies 416C, and upper terminal electrodes 416E (which form part of the second electrode line according to the invention), which extends outward from the ultrasonic transducers 51 arranged along the Y direction at opposite ends in the Y direction.

The common electrode sections 416B are provided on the opposite sides in the Y direction in an outer circumferential area Ar3, which is the area other than the array area Ar1. The +Y-side common electrode section 4161B connects the upper terminal electrodes 416E that extend from the ultrasonic transducers 51 provided on the +Y-side end, among the plurality of ultrasonic transducers 51 provided along the Y direction, toward the +Y side to one another. The −Y-side common electrode section 416B connects the upper terminal electrodes 416E that extend from the ultrasonic transducers 51 provided on the −Y-side end toward the −Y side to one another. Therefore, in the ultrasonic transducers 51 in the array area Ar1, the upper electrode 416 is kept at the same potential. Further, the pair of common electrode sections 416B are provided along the X direction, and the ends of the common electrode sections 4161B are drawn out of the array area Ar1 into the terminal areas Ar2. The common electrode sections 416B form the second electrode pads 416P, which are connected to the wiring terminal sections 231, which will be described later, in the terminal areas Ar2.

In the ultrasonic transducer array 50 described above, the ultrasonic transducers 51 arranged in the X direction and linked with one another by the lower electrode 414 form a single ultrasonic transducer group 51A driven with a single drive signal, and a plurality of ultrasonic transducer group 51A are arranged along the Y direction to form a two-dimensional array structure.

Configuration of Sealing Plate 42

Figure 6:
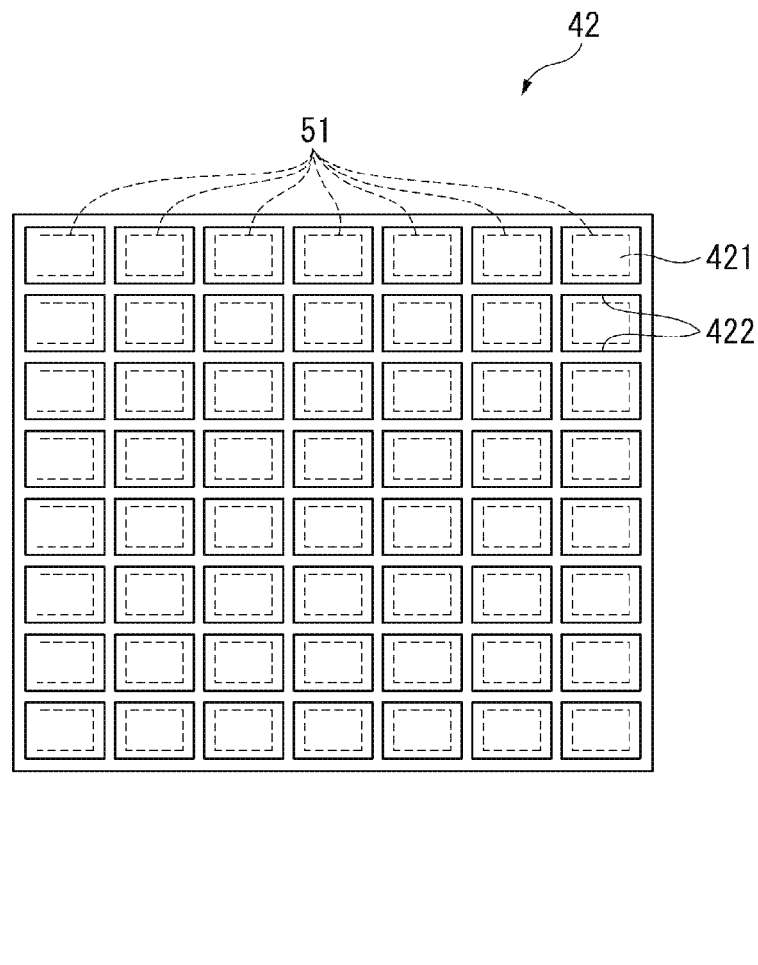
FIG. 6 is a plan view of a sealing plate of the ultrasonic device according to the first embodiment viewed from the side facing the element substrate.

FIG. 6 is a plan view of the sealing plate 42 viewed from the side facing the element substrate 41.

The sealing plate 42 corresponds to the array counter plate according to the invention, is formed for example, in a rectangular planar shape when viewed in the thickness direction, as shown in FIG. 6, and is formed of a semiconductor substrate, such as a silicon substrate, or an insulator substrate. The sealing plate 42 is arranged in a position where it overlaps with at least the array area Ar1 and is located in between the two terminal areas Ar2 in the X direction in a plan view, as shown in FIG. 3, and the sealing plate 42 is bonded to the element substrate 41 in the circumferential area Ar3, which is the area other than the array area Ar1, via, for example, a bonding film or an adhesive. The thus configured sealing plate 42 allows improvement in the substrate strength of the element substrate 41.

The material and the thickness of the sealing plate 42, which affect the frequency characteristic of the ultrasonic transducers 51, are preferably set on the basis of the center frequency of the ultrasonic wave transmitted and received by the ultrasonic transducers 51.

The sealing plate 42 has a plurality of recessed grooves (recessed sections) 421 formed in an array counter area Ar4 (see FIG. 4), which faces the array area Ar1 of the element substrate 41, and the plurality of recessed grooves 421 correspond to the ultrasonic transducers 51. A barrier section 422 is present between recessed grooves 421 adjacent to each other and separates the internal spaces formed by the adjacent recessed grooves 421.

Each of the thus formed recessed grooves 421 provides a gap 421A having a predetermined dimension between the recessed groove 421 and the element substrate 41 in an area (opening section 411A) of the corresponding vibration film 412, specifically, the area caused to vibrate by the corresponding ultrasonic transducer 51, whereby the vibration of the vibration film 412 is not inhibited.

Further, the barrier sections 422 are disposed in the positions of the areas of the substrate main body 411 (support sections 411B, see FIG. 5) other than the opening sections 411A between the ultrasonic transducers 51, and the barrier sections 422 support the substrate main body 411.

The configuration in which the barrier sections 422 separate the internal spaces S from each other prevents an inconvenience (crosstalk) produced by a situation in which backward wave from an ultrasonic transducer 51 is incident on another adjacent ultrasonic transducer 51.

The areas of the substrate main body 411 other than the opening sections 411A (support sections 411B) may be bonded to the barrier sections 422 of the sealing plate 42.

When the vibration films 412 vibrate, an ultrasonic wave is emitted not only toward the opening sections 411A (actuation surface 41B) but also toward, as a backward wave, the sealing plate 42 (rear surface 41A). The backward wave is reflected off the sealing plate 42 and radiated toward the vibration films 412 via the gaps 421A again. In this process, when the reflected backward wave and the ultrasonic wave emitted from the vibration films 412 toward the actuation surface 41B are out of phase with each other, the ultrasonic wave attenuates. To address the problem, in the present embodiment, the groove depth of each of the recessed grooves 421 is so set that the acoustic distance in the gap 421A is an odd multiple of one-fourth the wavelength $\lambda$ ($\lambda/4$) of the ultrasonic wave. In other words, the thickness dimensions of the element substrate 41, the sealing plate 42, and other portions are set in consideration of the wavelength $\lambda$ of the ultrasonic wave emitted from the ultrasonic transducers 51.

Configurations of Acoustic Matching Layer 43 and Acoustic Lens 44

The acoustic matching layer 43 is provided on the actuation surface 41B of the element substrate 41, as shown in FIG. 5. Specifically, the acoustic matching layer 43 fills the opening sections 411A of the element substrate 41 and has a predetermined thickness dimension measured from the actuation surface 41B of the substrate main body 411.

The acoustic lens 44 is provided on the acoustic matching layer 43 and exposed to the outside through the sensor window 21B of the enclosure 21, as shown in FIG. 1.

The acoustic matching layer 43 and the acoustic lens 44 allow the ultrasonic wave transmitted from the ultrasonic transducers 51 to efficiently propagate through a living body, which is a measurement target, and the ultrasonic wave reflected in the living body to efficiently propagate to the ultrasonic transducers 51. To this end, the acoustic matching layer 43 and the acoustic lens 44 are so set that the intermediate acoustic impedance thereof is a value between the acoustic impedance of the ultrasonic transducers 51 of the element substrate 41 and the acoustic impedance of the living body.

Configuration of Wiring Substrate 23

Figure 7:
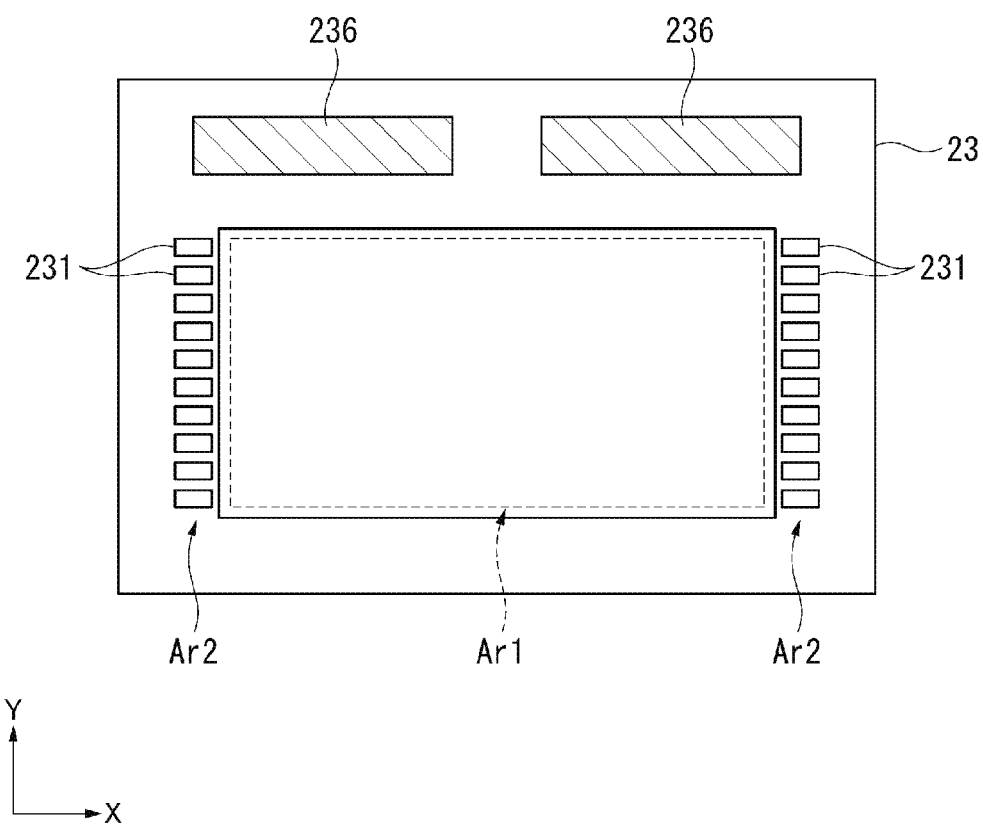
FIG. 7 is a plan view of a wiring substrate of the ultrasonic device according to the first embodiment viewed from the side facing the element substrate.

FIG. 7 is a plan view of the wiring substrate 23 viewed from the side facing the element substrate 41.

The wiring substrate 23 corresponds to the support substrate according to the invention, and the element substrate 41 is bonded to the wiring substrate 23. The wiring substrate 23 has wiring terminal sections 231 and a through hole 232, as shown in FIGS. 5 and 7.

The wiring terminal sections 231 correspond to the circuit terminal sections according to the invention and are provided in positions corresponding to the electrode pads 414P and 416P, which are provided in the terminal areas Ar2 of the protruding sections 41C of the element substrate 41. The wiring terminal sections 231 are bonded to the corresponding electrode pads 414P and 416P via the electrically conductive bonding members 45, which are made, for example, of solder. That is, the protruding sections 41C of the element substrate 41 are bonded to the wiring substrate 23 via the bonding members 45. Each set of the wiring terminal section 231 and the bonding member 45 is covered with a resin coating 45A.

The through hole 232 corresponds to the insertion section according to the invention, and the sealing plate 42 is inserted into the through hole 232, as shown in FIG. 5. The through hole 232 has a shape according to the sealing plate 42 in a plan view (rectangular shape in the example shown in FIG. 4), is so configured that the sealing plate 42 is inserted into the through hole 232, and passes through the wiring substrate 23 in the thickness direction. In the state in which the sealing plate 42 is inserted into the through hole 232, the electrode pads 414P and 416P are bonded to the wiring terminal sections 231 via the bonding members 45, so that the element substrate 41 is bonded to the wiring substrate 23.

The wiring substrate 23 is provided with a driver circuit and other components for driving the ultrasonic unit 22. Specifically, as shown in FIG. 2, the wiring substrate 23 includes a selection circuit 233, a transmission circuit 234, a reception circuit 235, and connector sections 236 (see FIG. 3).

The selection circuit 233 switches connection under the control of the controller 10 between transmission connection in which the ultrasonic unit 22 is connected to the transmission circuit 234 and reception connection in which the ultrasonic unit 22 is connected to the reception circuit 235.

The transmission circuit 234 operates when the connection is switched to the transmission connection under the control of the controller 10 and outputs, via the selection circuit 233, a transmission signal that causes the ultrasonic unit 22 to issue an ultrasonic wave.

The reception circuit 235 operates when the connection is switched to the reception connection under the control of the controller 10 and outputs, via the selection circuit 233, a reception signal inputted from the ultrasonic unit 22 to the controller 10. The reception circuit 235 is formed, for example, of a low-noise amplification circuit, a voltage controlled attenuator, a programmable gain amplifier, a low-pass filter, and an A/D converter, performs signal processing, such as conversion of the received signal into a digital signal, removal of noise components, and amplification to a desired signal level, and then outputs the processed received signal to the controller 10.

The connector sections 236 are connected to the transmission circuit 234 and the reception circuit 235. The cable 3 is connected to the connector sections 236, and the cable 3 is drawn out through the passage hole 21C of the enclosure 21 and connected to the controller 10, as described above.

Method for Implementing Ultrasonic Unit 22 onto Wiring Substrate 23

Figure 8A:
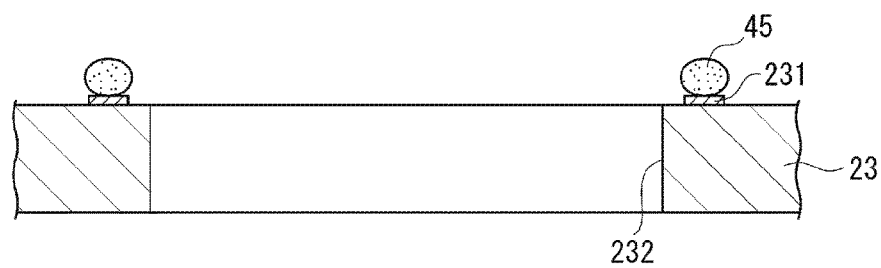
FIGS. 8A to 8C show a method for implementing an ultrasonic unit onto the wiring substrate in the first embodiment.
Figure 8B:
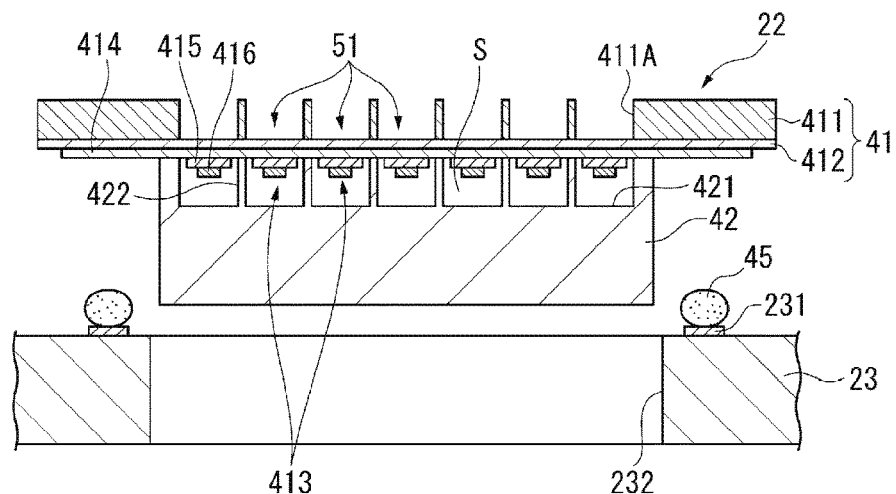
Figure 8C:
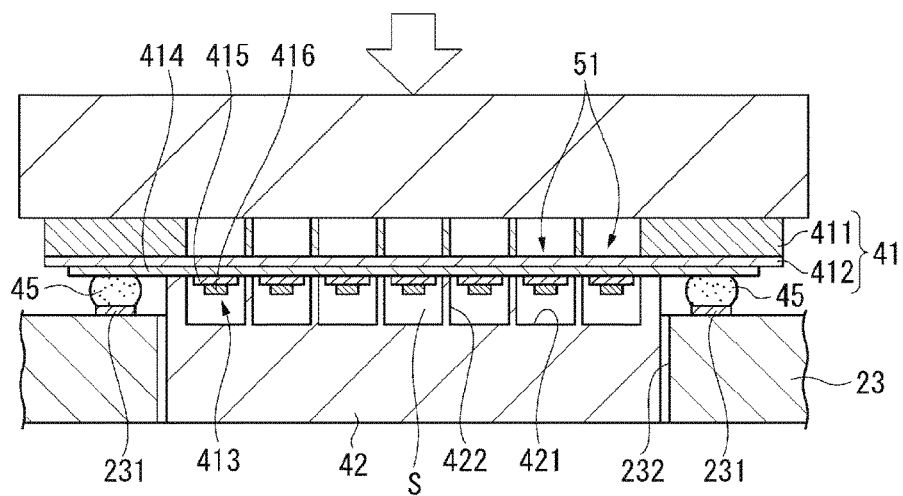

FIGS. 8A to 8C show a method for implementing the ultrasonic unit 22 onto the wiring substrate 23 in the present embodiment.

In the present embodiment, to achieve the connection between the ultrasonic unit 22 and the wiring substrate 23, the electrically conductive bonding member 45 made, for example, of solder, are first provided on the wiring terminal sections 231 provided in the positions facing the electrode pads 414P and 416P of the element substrate 41, as shown in FIG. 8A. It is noted that the wiring substrate 23 has been placed on a flat surface although not shown.

Thereafter, the ultrasonic unit 22 is layered on the wiring substrate 23 along the direction of a normal thereto (thickness direction) and pressed thereagainst by using a pressing member or any other tool, as shown in FIGS. 8B and 8C. As a result, the electrode pads 414P and 416P are bonded to the wiring terminal sections 231 via the bonding members 45. Each set of the electrode pad 414P or 416P and the wiring terminal section 231 is then coated with the resin coating 45A. The ultrasonic unit 22 can thus be readily implemented on the wiring substrate 23.

Figure 9:
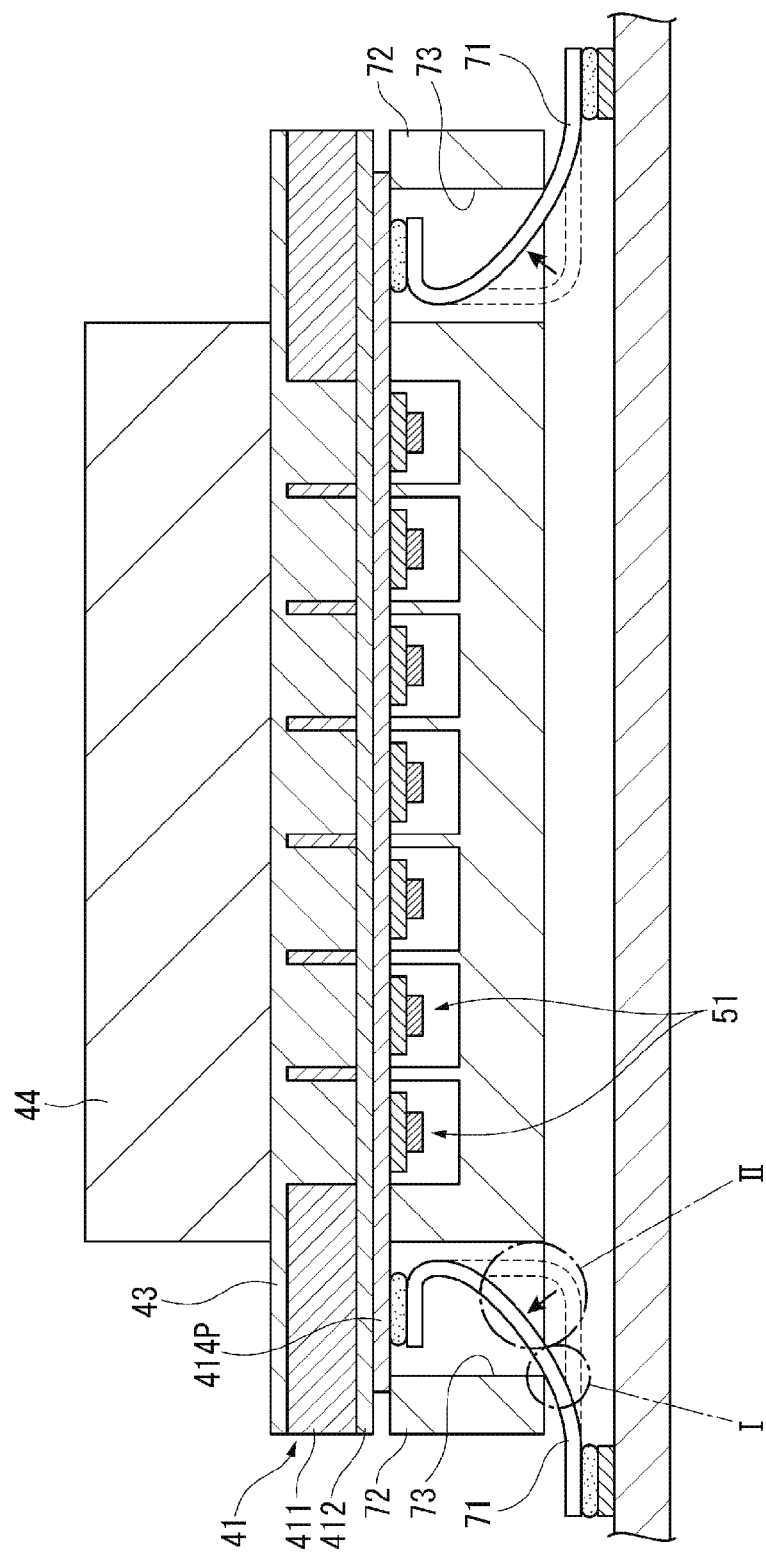
FIG. 9 is a cross-sectional view showing an example of the configuration of an ultrasonic device of related art.

FIG. 9 is a cross-sectional view diagrammatically showing the configuration of a related art example in which the ultrasonic unit 22 is electrically connected to the wiring substrate 23 via an FPC 71. In the related art example shown in FIG. 9, a sealing plate 72 has roughly the same exterior shape as that of the element substrate 41 in a plan view and is provided with an opening 73 through which the electrode pads 414P and 416P are exposed. One end of the FPC 71 is inserted into the opening 73 and connected to the electrode pads 414P and 416P. The FPC 71 is bent in the vicinity of the lower corner of the opening 73 and extends along the wiring substrate 23 in such away that the other end of the FPC 71 is directed toward the outer circumference of the wiring substrate 23. The other end of the FPC 71 is then connected to the wiring terminal sections 231 of the wiring substrate 23. In the thus configured related art example, the FPC 71 could be disconnected when it comes into contact with the lower corner of the opening 73 in the sealing plate 72 (see area I in FIG. 9). Further, the ultrasonic unit 22 could be lifted due to a change in the angle of the bent portion of the FPC 71 or tension of the FPC 71 (see area II in FIG. 9).

In contrast, in a configuration employing face-down implementation, such as the configuration in the present embodiment, no disconnection due to the contact between the FPC 71 and the lower corner of the opening 73 in the sealing plate 72 occurs unlike the case of the related art shown in FIG. 9, whereby wiring reliability is improved. Further, since no lift of the ultrasonic unit 22 due to the tension of the FPC occurs, the ultrasonic transducer array 50 can accurately transmit an ultrasonic wave in a desired direction and accurately receive an ultrasonic wave along a desired direction.

Further, when one end of the FPC 71 is connected to the ultrasonic unit 22 and the resin coating 74 is coated followed by connection of the other end of the FPC 71 to the wiring substrate 23, the heated FPC 71 and resin coating 74 could undesirably deform due, for example, to thermal shrinkage.

In contrast, in the present embodiment, the electrode pads 414P, 416P and the wiring terminal sections 231 are connected to each other and covered with the resin coatings 45A, followed by no heating. A situation in which the resin coatings 45A deform due, for example, to thermal shrinkage to produce stress acting on the ultrasonic unit 22 can therefore be avoided, whereby a situation in which the stress deforms the element substrate 41 or causes other types of failure can be suppressed.

Configuration of Controller 10

The controller 10 includes, for example, an operation section 11, a display section 12, a storage section 13, and a computation section 14, as shown in FIG. 2. The controller 10 may, for example, be a tablet terminal, a smartphone, a personal computer, or any other terminal device or may instead be a dedicated terminal device for operating the ultrasonic probe 2.

The operation section 11 is a user interface (UI) for allowing a user to operate the ultrasonic measurement apparatus 1 and can be formed, for example, of a touch panel, operation buttons, a keyboard, or a mouse with which the display section 12 is provided.

The display section 12 is formed, for example, of a liquid crystal display and displays an image.

The storage section 13 stores a variety of programs and a variety of sets of data for controlling the ultrasonic measurement apparatus 1.

The computation section 14 is formed, for example, of a CPU (central processing unit) or any other computation circuit and a memory or any other storage circuit. The computation section 14 reads and executes the variety of programs stored in the storage section 13 to, for example, control the transmission circuit 234 to cause it to generate and output the transmission signal and further control the reception circuit 235 to cause it to set the frequency of the reception signal and the gain applied thereto.

Advantageous Effects of First Embodiment

The wiring substrate 23 has the through hole 232, which opens toward the element substrate 41 and into which the sealing plate 42 is inserted from the side facing the element substrate 41. The ultrasonic device 24 is so assembled that the element substrate 41 is bonded to the wiring substrate 23 via the bonding members 45 with the sealing plate 42 inserted into the through hole 232.

In this configuration, the thickness dimension of the ultrasonic device 24 can be reduced by the thickness dimension of the sealing plate 42 inserted into the through hole 232, as compared with the thickness dimension of an ultrasonic device having the configuration of related art in which a support substrate, a sealing plate, and an element substrate each having a predetermined thickness dimension are sequentially layered on each other in the substrate thickness direction, whereby the size of the ultrasonic device 24 can be reduced. Further, it is not necessary to reduce the dimension of the sealing plate in order to reduce the size of the ultrasonic device 24, whereby a decrease in the rigidity of the sealing plate can be avoided. As described above, according to the present embodiment, an ultrasonic device 24 having desired rigidity and a compact size can be provided. Further, an ultrasonic measurement apparatus 1 having desired strength and a compact size can be provided.

The through hole 232 is so provided as to pass through the wiring substrate 23. In this configuration, even when the sealing plate 42 has a thickness greater than or equal to the thickness dimension of the wiring substrate 23, the array counter plate can be inserted into the through hole 232 by a desired amount of insertion. That is, the position of the element substrate 41 can be set irrespective of the thickness dimension of the sealing plate 42, whereby the ultrasonic device 24 can be designed with increased flexibility. For example, bonding the element substrate 41 to the wiring substrate 23 with the wiring substrate 23 placed on a flat surface achieves an arrangement in which the surface of the sealing plate 42 on the side opposite the element substrate 41 and the surface of the wiring substrate 23 on the side opposite the element substrate 41 are flush with each other in the thickness direction. In this case, the element substrate 41 can be disposed in a desired position in the substrate thickness direction relative to the wiring substrate 23.

The element substrate 41 has the protruding sections 41C, which are bonded to the wiring substrate 23. In the present embodiment, the protruding sections 41C of the element substrate 41 are bonded to the wiring substrate 23 with the sealing plate 42 inserted into the through hole 232. In this configuration, in the state in which the sealing plate 42 is inserted into the through hole 232, the position of the element substrate 41 relative to the wiring substrate 23 in a plan view can be readily adjusted, whereby the positioning accuracy can be improved.

The bonding members 45 are made of an electrically conductive material and directly bond the electrode pads 414P and 416P provided on the element substrate 41 to the wiring terminal sections 231 provided on the wiring substrate 23 so that the element substrate 41 is bonded to the wiring substrate 23 (face-down implementation). As a result, work steps in the implementation of the ultrasonic unit 22 can be simplified, whereby the manufacturing efficiency can be improved.

Further, as shown in FIG. 9, in the implementation, when the electrode pads 414P and 416P and the wiring terminal sections 231 are bonded to the flexible printed circuit by using solder, the flexible printed circuit is heated twice, that is, one end side of the flexible printed circuit is heated and the other end side thereof is then heated, resulting in an increase in the number of heating steps. In this case, by the time of the second heating, the resin material of the resin coating or any other component that covers the bonded portion of the flexible printed circuit is thermally shrunk or deformed, possibly resulting in stress acting on the element substrate 41 and deformation of the element substrate 41. In contrast, in the present embodiment, the face-down implementation allows the electrode pads 414P and 416P to be bonded to the wiring terminal sections 231 in single heating operation, whereby the deformation of the element substrate 41 described above can be suppressed.

The sealing plate 42 includes the recessed grooves 421, which are provided in the positions where the recessed grooves overlap with the ultrasonic transducers 51, and the barrier sections 422, which separate the recessed grooves 421 from each other and support the element substrate 41, specifically, the regions between the ultrasonic transducers 51 and other than the regions where the vibration films 412 are formed. In the configuration described above, since the recessed grooves 421 corresponding to the ultrasonic transducers 51 are separated from each other by the barrier sections 422, crosstalk between the ultrasonic transducers can be suppressed. Further, since the barrier sections 422 support the wiring substrate 23, bending of the element substrate 41 can be suppressed.

Second Embodiment

A second embodiment according to the invention will next be described.

Figure 10:
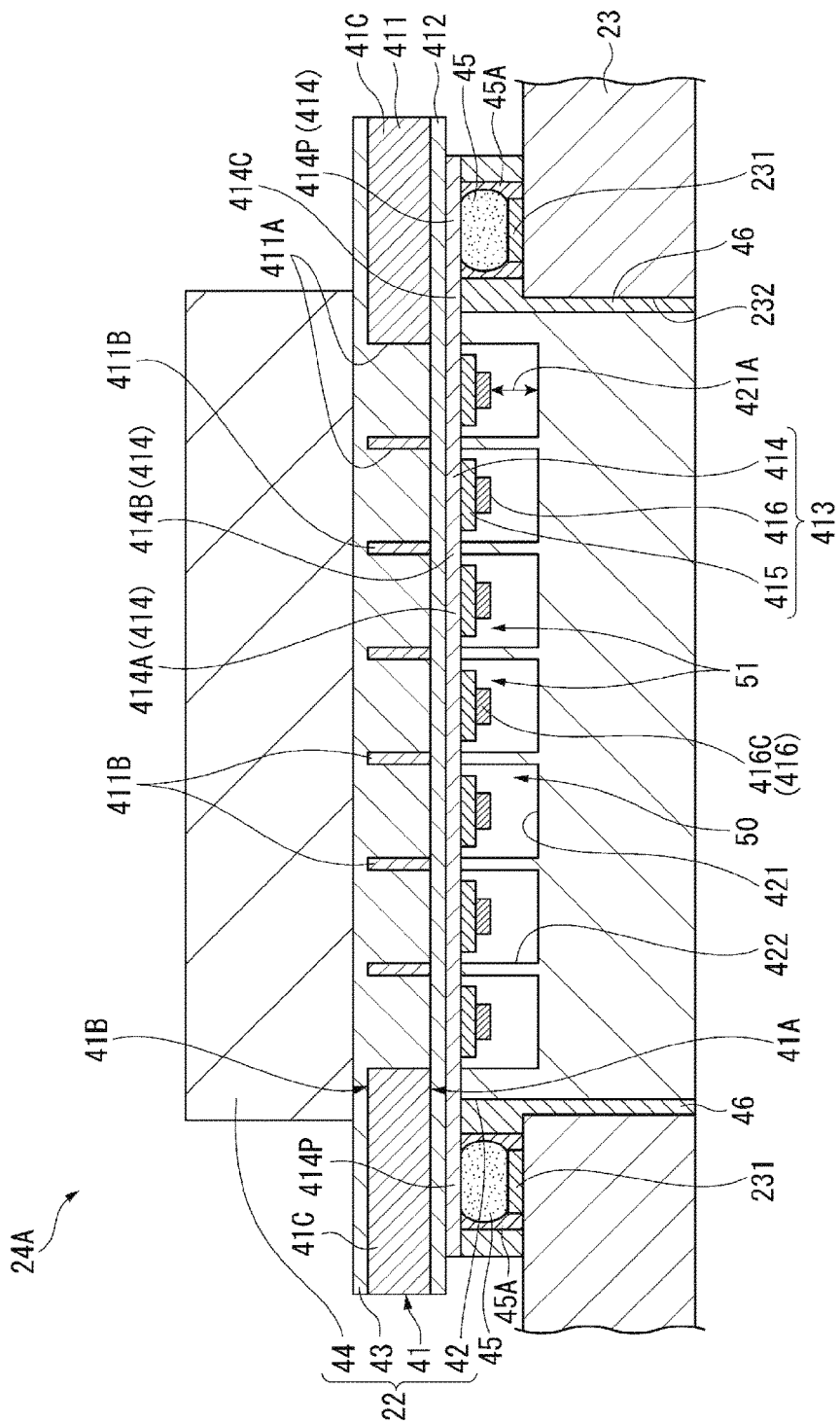
FIG. 10 is a cross-sectional view of an ultrasonic device according to a second embodiment.

FIG. 10 is a cross-sectional view of an ultrasonic device according to the second embodiment.

An ultrasonic device 24A according to the second embodiment further includes, in addition to the components of the ultrasonic device according to the first embodiment, a resin member 46 as a fixing member that fixes the sealing plate 42 to the wiring substrate 23, as shown in FIG. 10. The ultrasonic device 24A according to the second embodiment is basically configured in roughly the same manner as in the ultrasonic device 24 according to the first embodiment except that the ultrasonic device 24A includes the resin member 46. In the following description, the same configurations as those in the first embodiment have the same reference characters, and the description of the same configurations will be omitted or simplified.

The resin member 46 corresponds to the fixing member according to the invention and fills the gap between the ultrasonic unit 22 and the wiring substrate 23. That is, the resin member 46 fills the gap between the inner surface of the through hole 232 and the sealing plate 42 and the area sandwiched between the element substrate 41 and the wiring substrate 23. The resin member 46 bonds the sealing plate 42 to the wiring substrate 23. The resin member 46 can, for example, be an epoxy-based adhesive.

Advantageous Effects of Second Embodiment

In the present embodiment, the sealing plate 42 inserted into the through hole 32 is fixed to the wiring substrate 23 via the resin member 46. As a result, for example, even when force in the direction from the actuation surface 41B toward the rear surface 41A acts on the ultrasonic device 24A, for example, at the time of measurement, deformation of the element substrate 41 due to movement of the sealing plate 42 in the through hole 232 and breakage of the element substrate 41 due to the deformation the amount of which exceeds an allowable range can be avoided.

Further, in the present embodiment, an adhesive is used as the resin member 46. Therefore, in the state in which the sealing plate 42 is inserted into the through hole 232, the sealing plate 42 can be fixed to the wiring substrate 23, for example, in a simple method in which the adhesive is caused to flow into the gap between the inner surface of the through hole 232 and the sealing plate 42 and then caused to cure.

Third Embodiment

A third embodiment according to the invention will next be described.

In the ultrasonic device according to the first embodiment, the wiring substrate 23 is provided with the through hole 232, which passes through the wiring substrate 23 in the substrate thickness direction. In contrast, the ultrasonic device according to the third embodiment differs from the ultrasonic device according to the first embodiment in that a groove section replaces the through hole 232 described above.

Figure 11:
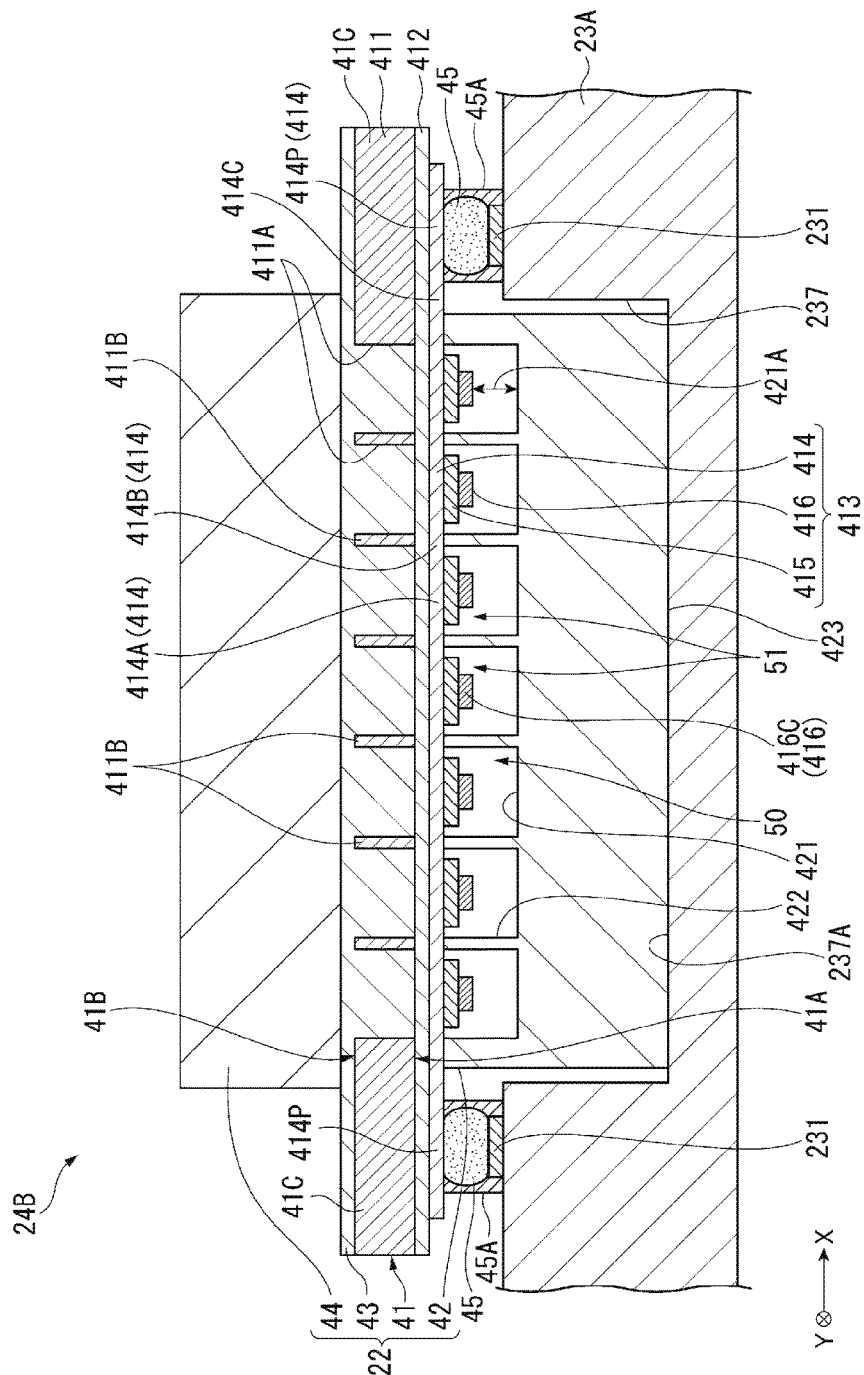
FIG. 11 is a cross-sectional view of an ultrasonic device according to a third embodiment.

FIG. 11 is a cross-sectional view of the ultrasonic device according to the third embodiment.

A wiring substrate 23A in an ultrasonic device 24B has a groove section 237, as shown in FIG. 11.

The groove section 237 corresponds to the first groove section according to the invention and is provided in the same position as that of the through hole 232 in the first embodiment (see FIG. 5) in a plan view, and the sealing plate 42 is inserted into the groove section 237. The groove section 237 has a bottom surface (first bottom surface) 237A, which faces the element substrate 41, and an end section 423 of the sealing plate 42 on the side opposite the element substrate 41 (that is, the end surface of the sealing plate 42 on the side opposite the element substrate 41) comes into contact with the bottom surface 237A. In this configuration, since the bottom surface 237A supports the end section 423 of the sealing plate 42, movement of the sealing plate 42 toward the side opposite the element substrate 41 can be avoided, and a warp of the element substrate 41 due to stress toward the sealing plate 42 can therefore be avoided.

In the present embodiment, the end section 423 of the sealing plate 42 comes into contact with the bottom surface 237A of the groove section 237. The configuration described above is not necessarily employed, and the end section 423 may be separate from the bottom surface 237A. In this case, the dimension of the gap between the end section 423 and the bottom surface 237A in the substrate thickness direction is preferably so set that the amount of warp of the element substrate 41 (the amount of movement of the sealing plate 42) fall within an allowable range. As a result, a decrease in the accuracy at which the ultrasonic device is driven, damage of the element substrate 41, and other problems due to the warp of the element substrate 41 toward the sealing plate 42 can be avoided.

Advantageous Effects of Third Embodiment

The groove section 237 is a section into which the sealing plate 42 is inserted. The bottom surface 237A of the groove section 237 comes into contact with the end section 423 of the sealing plate 42. In this configuration, the warp of the element substrate 41 can be avoided, and a decrease in the accuracy at which the ultrasonic device is driven, damage of the element substrate 41, and other problems due to the warp can be avoided.

Further, in the present embodiment, in the state in which the end section 423 of the sealing plate 42 is in contact with the bottom surface 237A, the element substrate 41 can be bonded to the wiring substrate 23A. As a result, the sealing plate 42, that is, the element substrate 41 can be positioned in the substrate thickness direction. That is, since the amount of insertion of the sealing plate 42 can be set by the dimension of the groove section 237 in the thickness direction, the element substrate 41 can be positioned, and the positioning can be readily performed.

Variation of Third Embodiment

Figure 12:
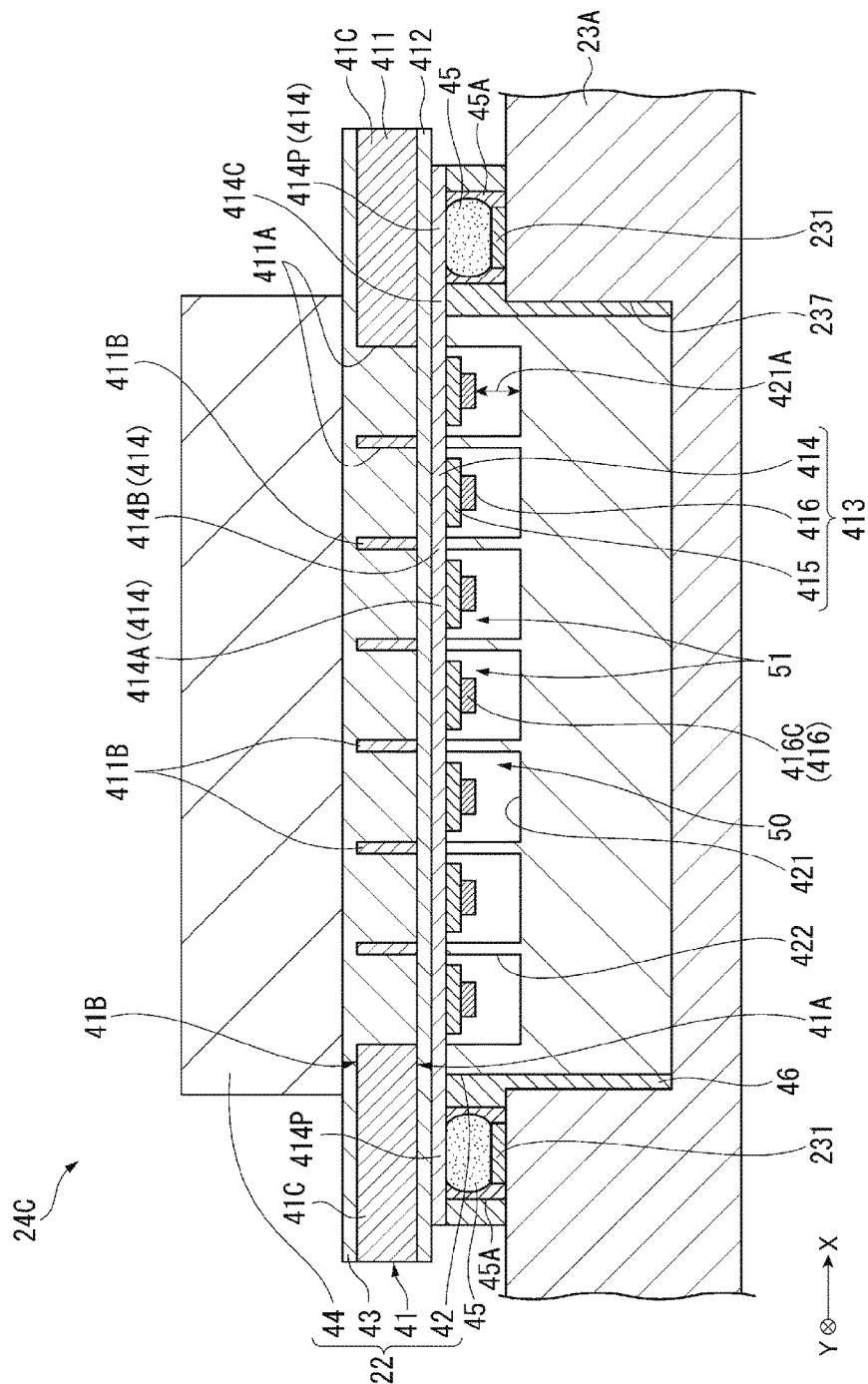
FIG. 12 is a cross-sectional view of an ultrasonic device according to a variation of the third embodiment.

FIG. 12 is a cross-sectional view of an ultrasonic device 24C according to a variation of the third embodiment.

In the ultrasonic device 24C shown in FIG. 12, the resin member 46 fills the gap between the inner surface of the groove section 237 and the sealing plate 42 and the area sandwiched between the element substrate 41 and the wiring substrate 23A.

In this configuration, the advantageous effects of the second embodiment described above as well as those of the third embodiment can be provided. That is, the element substrate 41 can be readily positioned with respect to the wiring substrate 23A. Further, the sealing plate 42 can be fixed to the wiring substrate 23A, whereby deformation and damage of the element substrate 41 can be avoided.

Fourth Embodiment

A fourth embodiment according to the invention will next be described.

Figure 13:
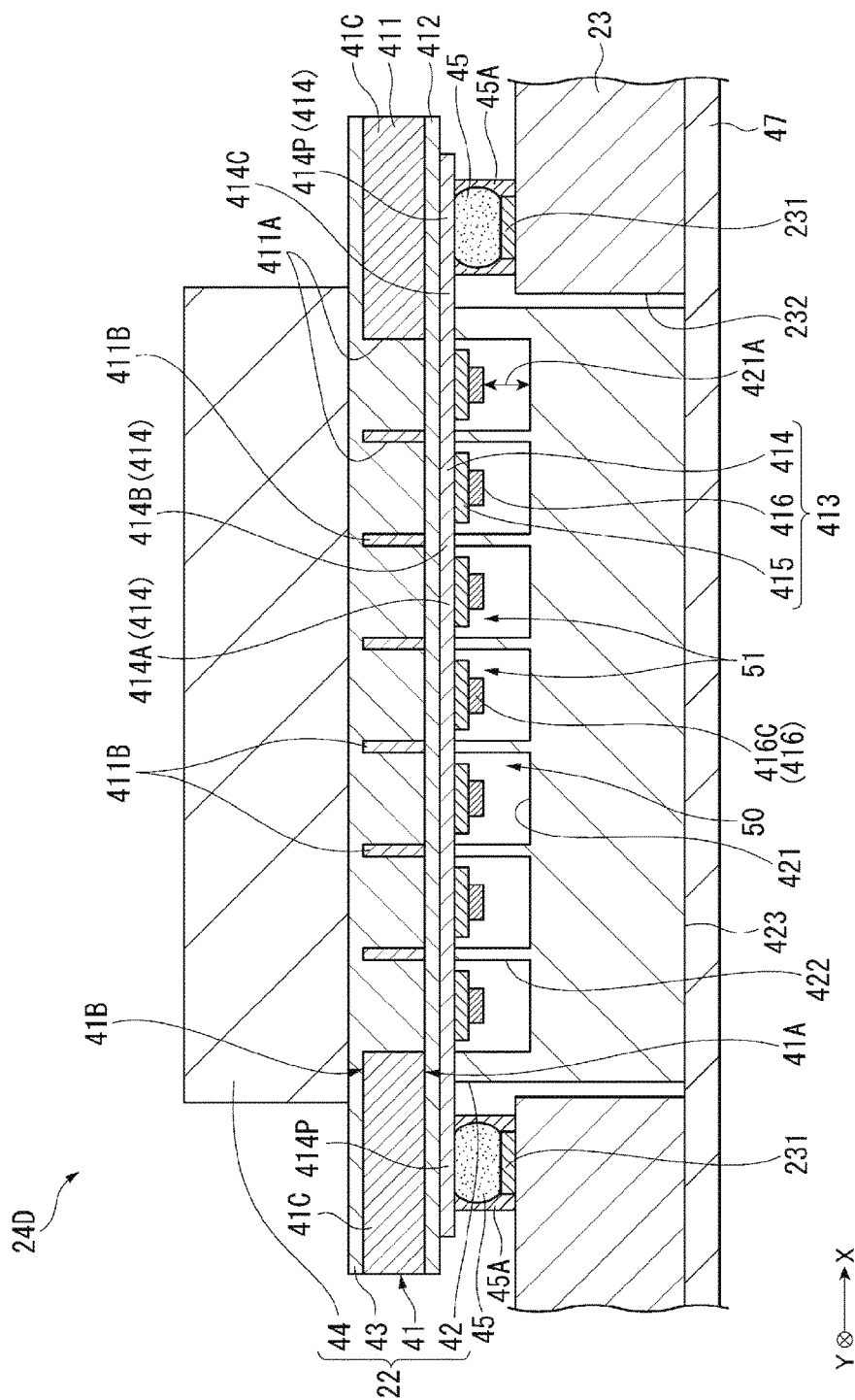
FIG. 13 is a cross-sectional view of an ultrasonic device according to a fourth embodiment.

FIG. 13 is a cross-sectional view of an ultrasonic device according to the fourth embodiment.

An ultrasonic device 24D according to the fourth embodiment further includes, in addition to the components of the ultrasonic device according to the first embodiment, a reinforcing plate 47, which covers the through hole 232 in the wiring substrate 23, as shown in FIG. 13.

The reinforcing plate 47 is a rectangular member in a plan view viewed in the thickness direction and bonded to one side of the wiring substrate 23, specifically, the side opposite the element substrate 41. The reinforcing plate 47 is so positioned as to overlap with at least the through hole 232 in a plan view viewed in the thickness direction and closes one end of the through hole 232 (closes the opening on the side opposite the side where the sealing plate 42 is inserted). The reinforcing plate 47 has rigidity higher than the rigidity of the wiring substrate 23 and the sealing plate 42 and is made, for example, of a metal material, such as 42 alloy.

One surface of the reinforcing plate 47, the surface facing the through hole 232 (surface facing element substrate 41), is in contact with the end section 423 of the sealing plate 42.

In this configuration, since the end section 423 of the sealing plate 42 is supported by the reinforcing plate 47, a situation in which the sealing plate 42 moves toward the side opposite the element substrate 41 can be avoided, whereby a situation in which the element substrate 41 warps due to stress produced therein toward the sealing plate 42 can be avoided.

The ultrasonic device 24D described above can be implemented on the wiring substrate 23 in basically the same method as the method for implementing the ultrasonic device 24 according to the first embodiment shown in FIGS. 8A to 8C. That is, after the reinforcing plate 47 is bonded to the wiring substrate 23, the ultrasonic unit 22 is implemented on the wiring substrate 23 in the face-down implementation operation. In this case, causing the sealing plate 42 to come into contact with the reinforcing plate 47 allows the ultrasonic unit 22 and the sealing plate 42 to be positioned with respect to the wiring substrate 23 in the thickness direction.

The method for implementing the ultrasonic device 24D is not limited to the method described above, and after the ultrasonic unit 22 is implemented on the wiring substrate 23, the reinforcing plate 47 may be bonded to the wiring substrate 23.

In the present embodiment, the end section 423 of the sealing plate 42 is in contact with the reinforcing plate 47, but the configuration described above is not necessarily employed. The end section 423 may be separate from the reinforcing plate 47, as in the third embodiment. In this case, the dimension of the gap between the end section 423 and the reinforcing plate 47 in the substrate thickness direction is preferably so set that the amount of warp of the element substrate 41 falls within an allowable range. As a result, a decrease the accuracy at which the ultrasonic device is driven, damage of the element substrate 41, and other problems due to the warp of the element substrate 41 toward the sealing plate 42 can be avoided.

Advantageous Effects of Fourth Embodiment

In the present embodiment, the reinforcing plate 47 is bonded to the wiring substrate 23, specifically, the surface thereof on the side opposite the element substrate 41, and the sealing plate 42 comes into contact with the reinforcing plate 47, specifically, the surface thereof facing the through hole 232. In this configuration, in the state in which the sealing plate 42 is in contact with the reinforcing plate 47, the element substrate 41 can be bonded to the wiring substrate 23. As a result, the sealing plate 42, that is, the element substrate 41 can be positioned in the substrate thickness direction. Further, the reinforcing plate 47 can reinforce the wiring substrate 23, and the strength of the ultrasonic device 24D (ultrasonic unit 22) can be improved.

Variation of Fourth Embodiment

Figure 14:
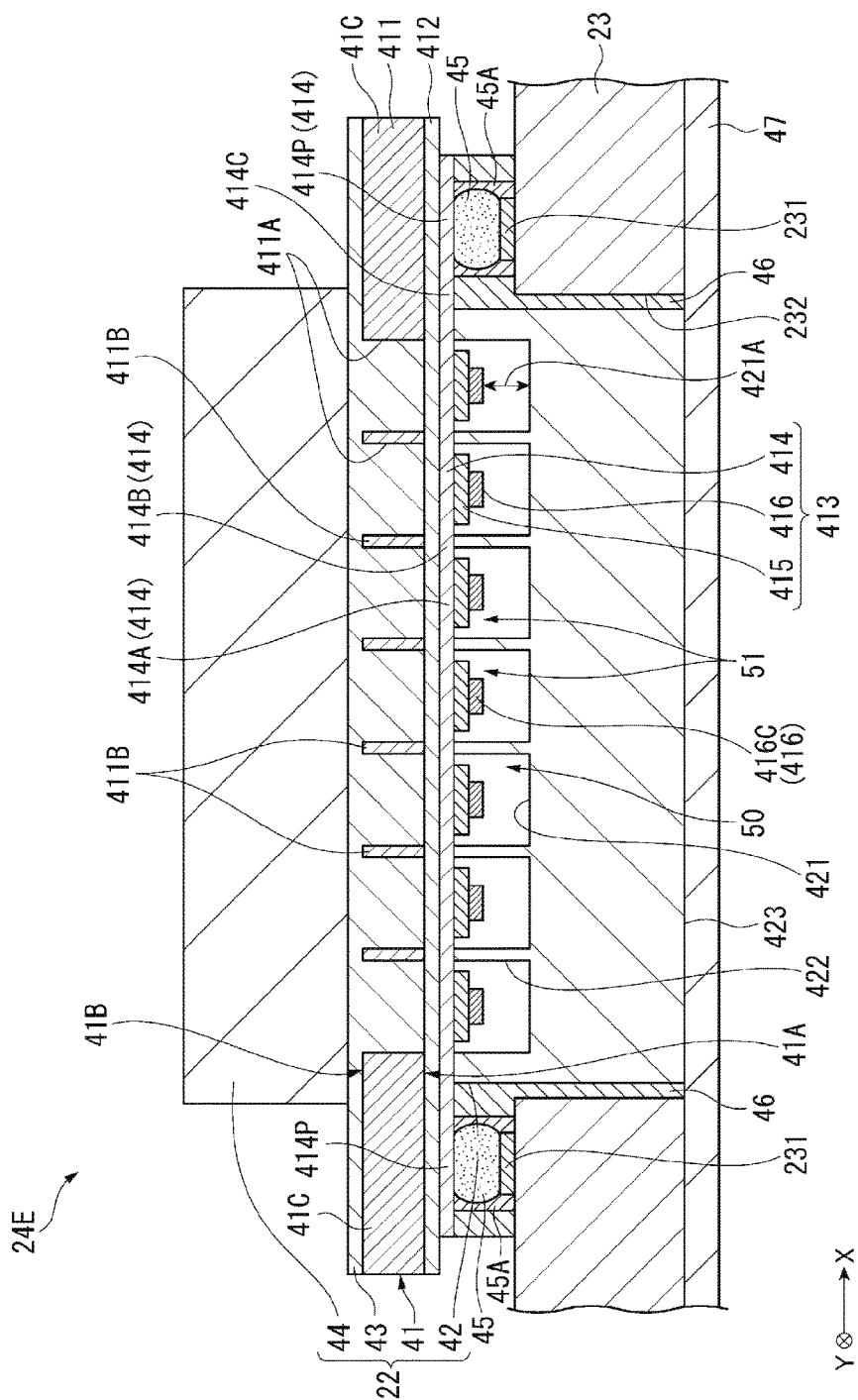
FIG. 14 is a cross-sectional view of an ultrasonic device according to a variation of the fourth embodiment.

FIG. 14 is a cross-sectional view of an ultrasonic device 24E according to a variation of the fourth embodiment.

The ultrasonic device 24E further includes, in addition to the components of the ultrasonic device 24D according to the fourth embodiment, the resin member 46, which bonds the sealing plate 42 to the wiring substrate 23 and the reinforcing plate 47, as shown in FIG. 14.

The resin member 46 fills the space surrounded by the inner surface of the through hole 232, the sealing plate 42, and the reinforcing plate 47 and the area sandwiched between the element substrate 41 and the wiring substrate 23. The resin member 46 bonds the sealing plate 42 to the wiring substrate 23 and the reinforcing plate 47.

In this configuration, the advantageous effects of the second embodiment described above as well as those of the fourth embodiment can be provided. That is, the element substrate 41 can be readily positioned with respect to the wiring substrate 23. Further, the sealing plate 42 can be fixed to the wiring substrate 23, whereby deformation and damage of the element substrate 41 can be avoided.

Fifth Embodiment

A fifth embodiment according to the invention will next be described.

In the ultrasonic device according to the fourth embodiment, the wiring substrate 23 is provided with the through hole 232, which passes through the wiring substrate 23 in the substrate thickness direction, and the flat-plate-shaped reinforcing plate 47 is so bonded to the wiring substrate 23 as to cover the through hole 232. In contrast, the ultrasonic device according to the fifth embodiment differs from the ultrasonic device according to the fourth embodiment in that a second groove section is provided in the reinforcing plate described above and in a position where the second groove section coincides with the through hole 232 in a plan view.

Figure 15:
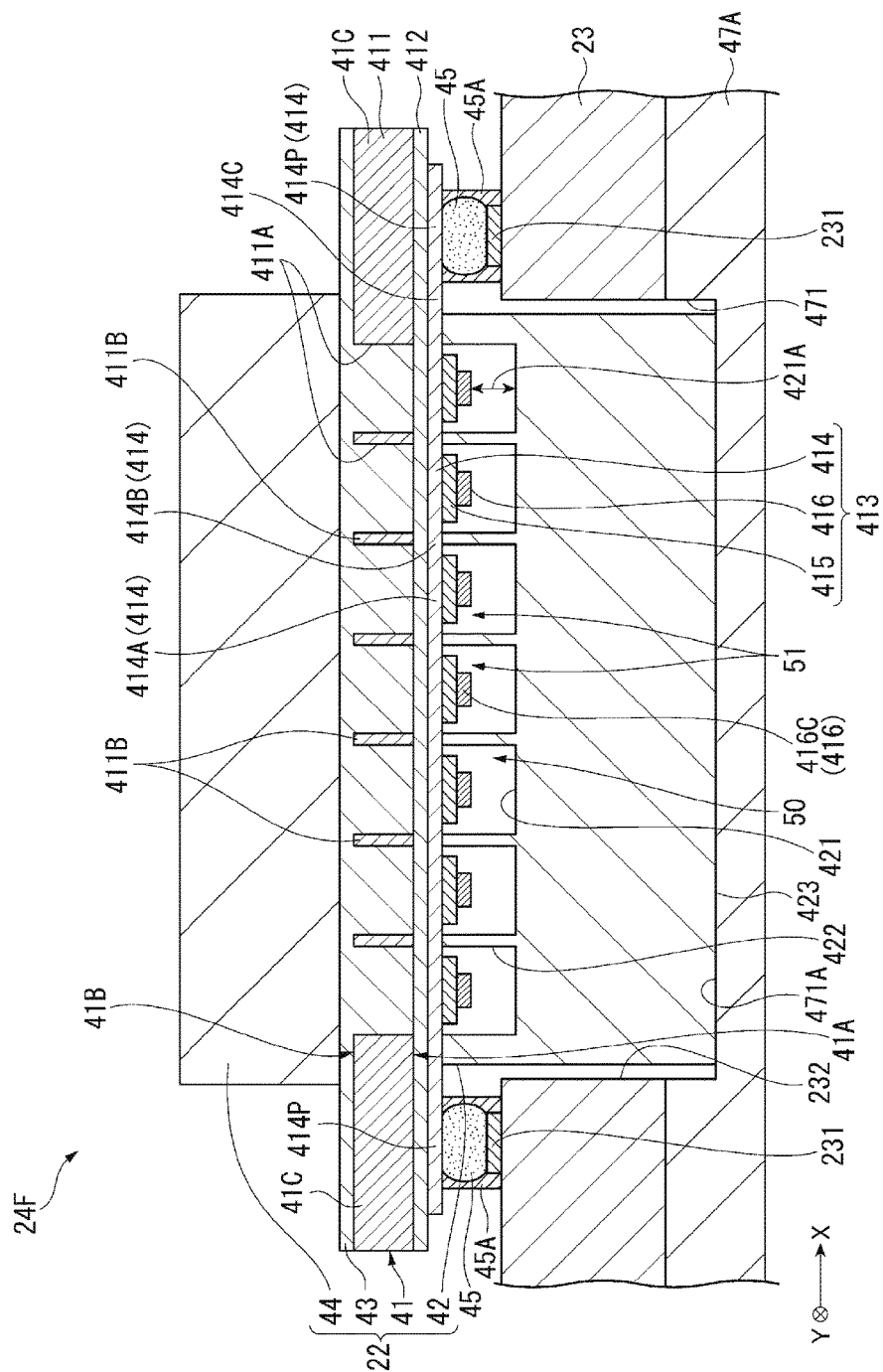
FIG. 15 is a cross-sectional view of an ultrasonic device according to a fifth embodiment.

FIG. 15 is a cross-sectional view of the ultrasonic device according to the fifth embodiment.

A reinforcing plate 47A in an ultrasonic device 24F has a second groove section 471, as shown in FIG. 15.

The second groove section 471 is provided in a position where the second groove section 471 coincides with the through hole 232 in a plan view, and the end section 423 of the sealing plate 42 is inserted into the second groove section 471. That is, in the present embodiment, the dimension of the sealing plate 42 in the substrate thickness direction is greater than the dimension of the wiring substrate 23. The end section 423 of the sealing plate 42 therefore protrudes through the through hole 232 and on the side opposite the element substrate 41 in the substrate thickness direction. The end section 423 of the sealing plate 42 is inserted into the second groove section 471 and comes into contact with a second bottom surface 471A of the second groove section 471.

Advantageous Effects of Fifth Embodiment

In the present embodiment, the end section 423 of the sealing plate 42, which is present on the side opposite the element substrate 41, protrudes from the wiring substrate 23 in the thickness direction and is inserted into the second groove section 471 provided in the reinforcing plate 47A. Further, in the state in which the end section 423 of the sealing plate 42 described above is in contact with the second bottom surface 471A of the second groove section 471, the element substrate 41 is bonded to the wiring substrate 23. The element substrate 41 can therefore be bonded to the wiring substrate 23 with the sealing plate 42 supported by the second bottom surface 471A. The sealing plate 42, that is, the element substrate 41 can therefore be positioned in the substrate thickness direction. In addition to this, since the amount of insertion of the sealing plate 42 can be set by the dimension of the second groove section 471 in the thickness direction, the ultrasonic device 24F can be designed with further increased flexibility.

Further, setting the planar shape of the second groove section 471 (the shape in a plan view viewed in the plate thickness direction of the reinforcing plate) to be a shape according to the planar shape of the sealing plate 42 allows alignment of the sealing plate 42 to be suitably performed and positional shift of the sealing plate 42 in the plane direction to be suppressed.

Variation of Fifth Embodiment

Figure 16:
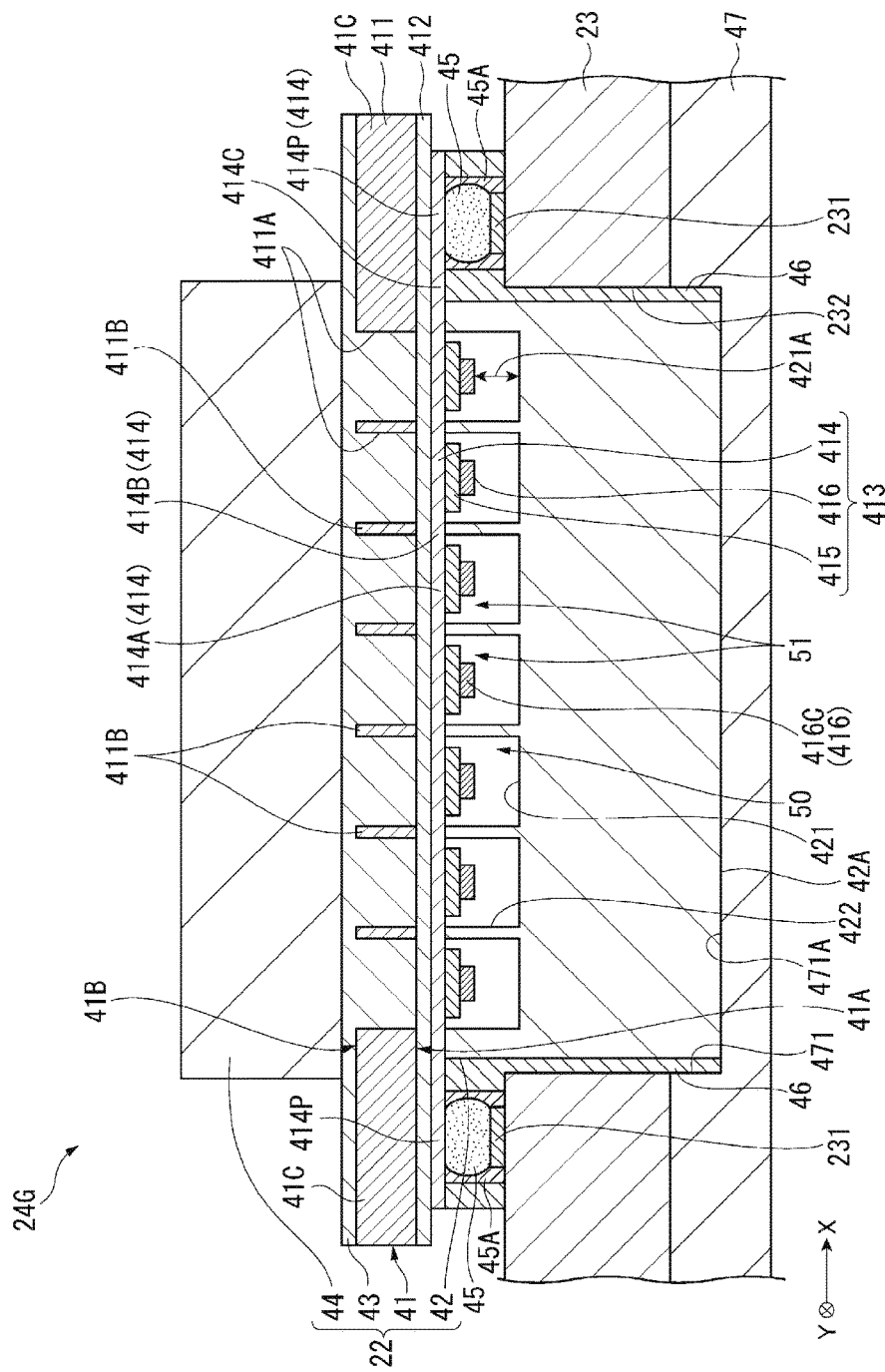
FIG. 16 is a cross-sectional view of an ultrasonic device according to a variation of the fifth embodiment.

An ultrasonic device 24G further includes, in addition to the components of the ultrasonic device 24F according to the fifth embodiment, the resin member 46, which bonds the sealing plate 42 to the wiring substrate 23 and the reinforcing plate 47, as shown in FIG. 16.

The resin member 46 fills the space surrounded by the inner surface of the through hole 232, the sealing plate 42, and the second groove section 471 of the reinforcing plate 47 and the area sandwiched between the element substrate 41 and the wiring substrate 23. That is, the resin member 46 bonds the sealing plate 42 to the wiring substrate 23 and the reinforcing plate 47.

In this configuration, the advantageous effects of the second embodiment as well as the advantageous effects of the fifth embodiment described above can be provided. That is, the element substrate 41 can be readily positioned with respect to the wiring substrate 23. Further, the sealing plate 42 can be fixed to the wiring substrate 23, whereby deformation and damage of the element substrate 41 can be avoided.

Sixth Embodiment

A sixth embodiment according to the invention will next be described.

In the ultrasonic device according to the first embodiment, the recessed grooves 421 corresponding to the ultrasonic transducers 51 are formed in the sealing plate 42. In contrast, the ultrasonic device according to the sixth embodiment differs from the ultrasonic device according to the first embodiment in that recessed grooves corresponding to ultrasonic transducer groups 51A, each of which includes a plurality of the ultrasonic transducers 51, are formed.

Figure 17:
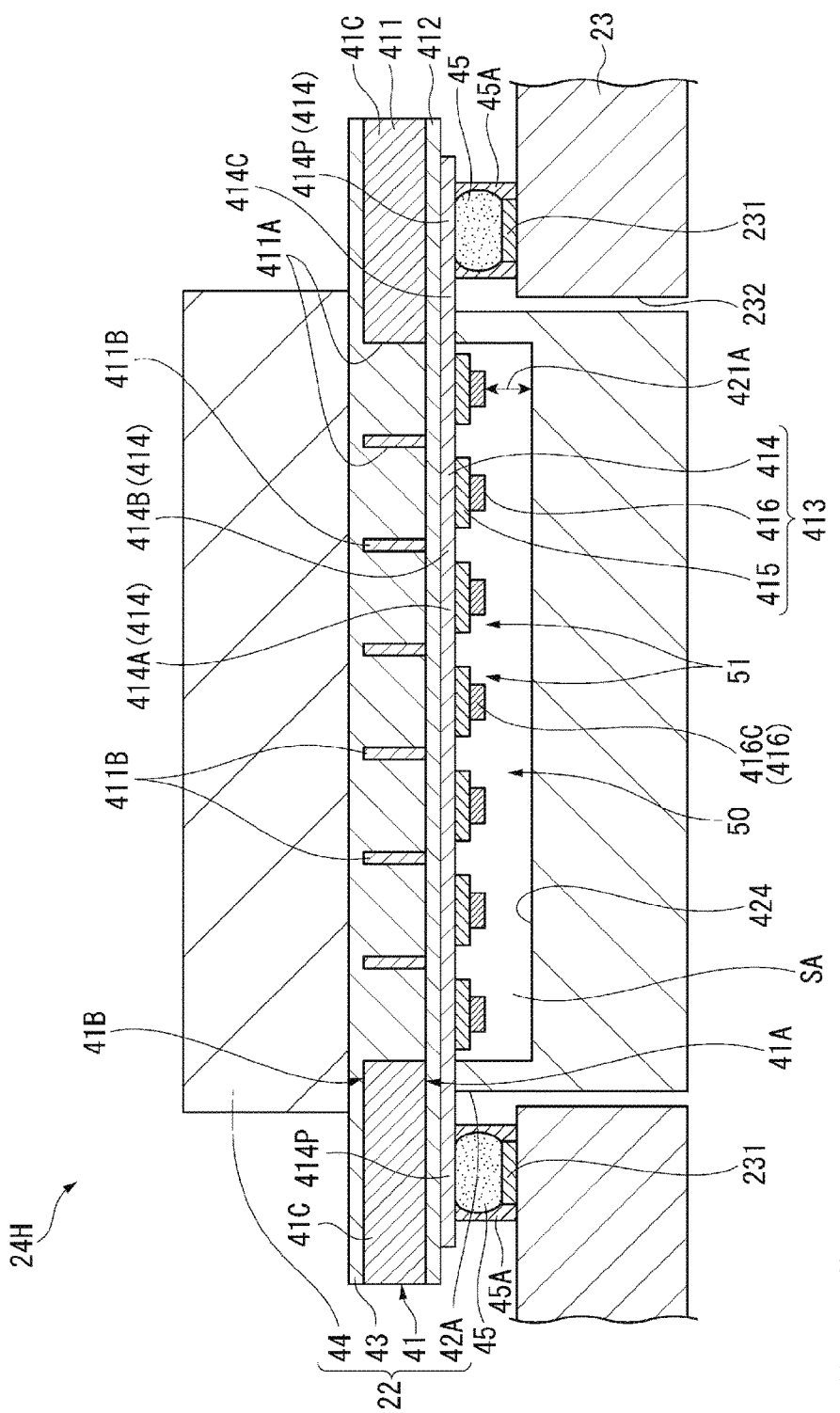
FIG. 17 is a cross-sectional view of an ultrasonic device according to a sixth embodiment.
Figure 18:
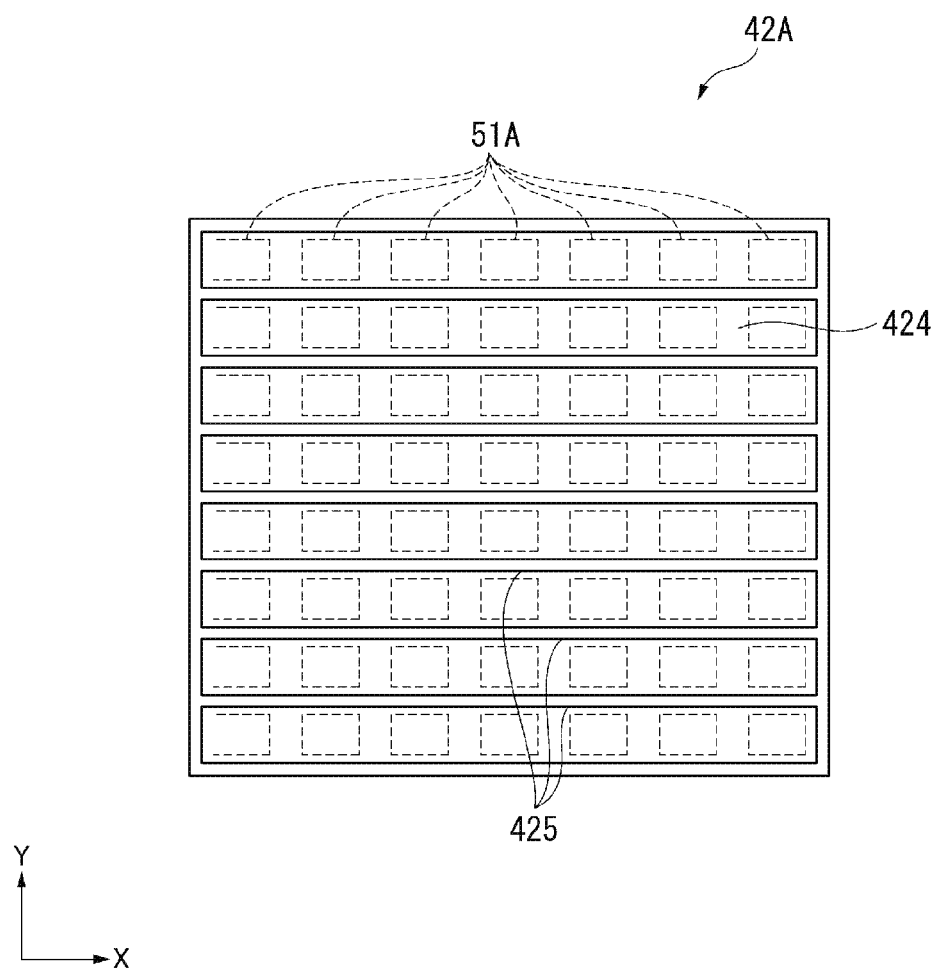
FIG. 18 is a plan view of a sealing plate of the ultrasonic device according to the sixth embodiment viewed from the side facing the element substrate.

FIG. 17 is a cross-sectional view of the ultrasonic device according to the sixth embodiment. FIG. 18 is a plan view of a sealing plate 42A viewed from the side facing the element substrate 41.

An ultrasonic device 24H includes a sealing plate 42A, as shown in FIG. 17.

The sealing plate 42A has a plurality of recessed grooves (recessed sections) 424 formed in the array counter area Ar4 (see FIG. 4) and corresponding to the ultrasonic transducer groups 51A, as shown in FIG. 18. The plurality of recessed grooves 424 are separated from each other by a plurality of barrier sections 425 provided along the X direction in a plan view in the substrate thickness direction. That is, the barrier section 425 between recessed grooves 424 adjacent to each other in the Y direction separates internal spaces SA formed by the recessed grooves 424.

Advantageous Effects of Sixth Embodiment

The sealing plate 42A has the recessed grooves 424 provided in the positions where the recessed grooves 424 overlap with the ultrasonic transducer groups 51A, and the internal spaces SA formed by the recessed grooves 424 are separated by the barrier sections 425. In this configuration, since the recessed grooves 424 corresponding to the ultrasonic transducer groups 51A are separated by the barrier sections 425, crosstalk between the ultrasonic transducer groups 51A can be suppressed.

Further, the barrier sections 425 support the element substrate 41, specifically, the regions between the ultrasonic transducer groups 51A and other than the regions where the vibration films 412 are formed. In the configuration described above, since the barrier sections 425 support the element substrate 41, bending of the element substrate 41 can be suppressed.

Variations

The invention is not limited to the embodiments described above, and a configuration achieved, for example, by a change, an improvement, and an appropriate combination of the embodiments to the extent that the advantage of the invention can be achieved falls within the scope of the invention.

In the embodiments described above, each of the through hole 232 and the groove section 237 as the insertion section has a shape according to the sealing plate 42 in a plan view, and out of the element substrate 41 and the sealing plate 42, only the sealing plate 42 is configured to be insertable into the insertion section. However, the invention is not necessarily configured this way and may employ a configuration in which both the element substrate 41 and the sealing plate 42 may be configured to be insertable into the insertion section and at least one of the element substrate 41 and the sealing plate 42 is supported by the wiring substrate 23. For example, the element substrate 41 and the sealing plate 42 may be so configured that the outer shape of the element substrate 41 coincides with the outer shape of the sealing plate 42 in a plan view in the substrate thickness direction and both the element substrate 41 and the sealing plate 42 are insertable into the insertion section. Further, the configuration in which the element substrate 41 is supported by the wiring substrate 23, as in each of the embodiments described above, is not necessarily employed, and only the sealing plate 42 may be fixed to and supported by the wiring substrate 23 via the fixing member, for example, the resin member 46.

In the first and second embodiments described above, the configuration in which one end of the sealing plate 42, specifically, the end on the side opposite the element substrate 41 is flush with the open end of the through hole 232 in the substrate thickness direction has been presented by way of example, but the invention is not necessarily configured this way. For example, although not shown, the end of the sealing plate 42 described above and the open end of the through hole 232 may be located in different positions in the substrate thickness direction. For example, at the time of implementation of the ultrasonic unit, a jig having protruding portions and recessed portions for positioning the sealing plate 42 in the substrate thickness direction may be placed in the position of the through hole 232 of the wiring substrate 23 to adjust the amount of insertion of the sealing plate 42 so as to position the sealing plate 42. As described above, employing the configuration in which the through hole 232 passes through the wiring substrate 23 allows the element substrate 41 and the sealing plate 42 to be positioned with respect to the wiring substrate 23 by using a simple method, for example, the method using the jig described above.

In the third embodiment described above, the configuration in which the sealing plate 42 is in contact with the bottom surface 237A of the groove section 237 is presented by way of example, but the invention is not necessarily configured this way. For example, the sealing plate 42 may be so disposed as to be separate from the bottom surface 237A. Further, the gap between the sealing plate 42 and the bottom surface 237A may be filled with the resin member 46, so that the end section 423 of the sealing plate 42 may be bonded to the bottom surface 237A. Similarly, in the fourth and fifth embodiments described above, the sealing plate may be so disposed as to be separate from the reinforcing plate, and the gap between the end section of the sealing plate and the reinforcing plate may be filled with the resin member.

In the second embodiment and the variations of the third to fifth embodiments described above, the configuration in which the resin member 46 as the fixing member that fixes the sealing plate 42 to the wiring substrates 23, 23A also fills the gaps between the wiring substrates 23, 23A and the element substrate 41 is presented by way of example, but the invention is not necessarily configured this way. For example, a configuration in which the resin member 46 fills only the gaps between the sealing plate 42 and the wiring substrates 23, 23A (inner surface of insertion section) but does not fill the gaps between the element substrate 41 and the wiring substrates 23, 23A may be employed. In this configuration, in which the resin member 46 is not in contact with the element substrate 41, even when the resin member 46 cures and shrinks, stress produced by the cure and shrinkage does not directly act on the element substrate 41. As a result, deformation of the element substrate 41 due to the stress can be more preferably avoided.

In each of the embodiments described above, the configuration in which the element substrate 41 is bonded to and supported by the wiring substrates 23, 23A is presented by way of example, but the invention is not necessarily configured this way. For example, the ultrasonic unit may be disposed between the element substrate 41 and the wiring substrates 23, 23A and may include a support substrate (relay substrate) that supports the element substrate 41. The support substrate may include through electrodes in the positions where the through electrodes reach the electrode pads 414P and 416P on the element substrate 41 and the wiring terminal sections 231 on the wiring substrate in a plan view viewed in the substrate thickness direction so that the electrode pads 414P and 416P are electrically continuous with the wiring terminal sections 231 via the through electrodes.

In each of the embodiments described above, in the ultrasonic transducer array 50, a one-dimensional array structure in which a plurality of ultrasonic transducers 51 arranged in the X direction form the ultrasonic transducer group 51A and the ultrasonic transducer groups 51A are arranged in the Y direction is presented by way of example, but the one-dimensional array structure is not necessarily employed. For example, lower electrodes 414 may be provided in correspondence with the ultrasonic transducers 51, individually drawn to the terminal areas Ar2, and connected to the wiring substrate 23. In this case, the ultrasonic transducers 51 can be individually driven, whereby the ultrasonic transducer array 50 can be driven as a two-dimensional array.

In each of the embodiments described above, the configuration in which electrically conductive members are used as the bonding members 45 to not only connect the electrode pads 414P and 416P on the element substrate 41 to the wiring terminal sections 231 on the wiring substrates 23, 23A but also bond the element substrate 41 to the wiring substrates 23, 23A is presented by way of example, but the invention is not necessarily configured this way. For example, bonding members that bond the element substrate 41 to the wiring substrates 23, 23A and connecting members that connect the electrode pads 414P and 416P to the wiring terminal sections 231 may be separately provided.

As the ultrasonic measurement apparatus 1, the configuration for measuring an internal tomographic structure of a living body is presented by way of example. In addition, for example, the ultrasonic measurement apparatus 1 can be used as a measurement instrument for inspecting a concrete internal structure of a concrete building or any other object.

Further, the ultrasonic measurement apparatus 1 including the ultrasonic unit 22 is presented by way of example, and the ultrasonic unit 22 can be used in other electronic instruments. For example, the ultrasonic unit 22 can be used in an ultrasonic washer that transmits an ultrasonic wave to a target to be washed to ultrasonically wash the target to be washed.

Figure 19:
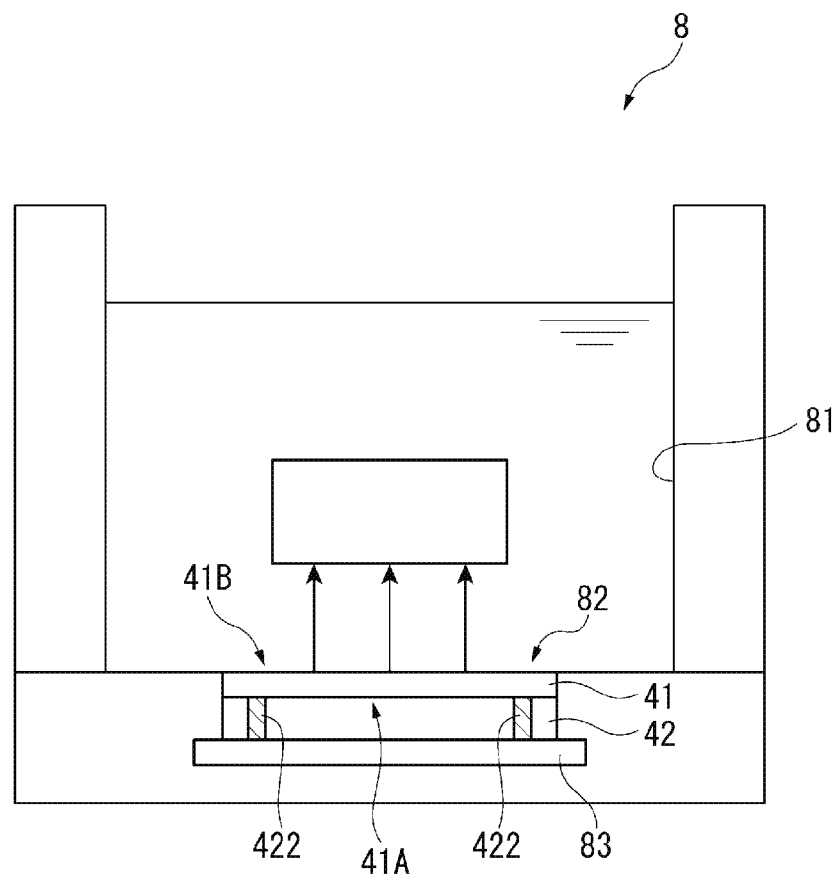
FIG. 19 shows an example of an electronic instrument according to another embodiment.

FIG. 19 shows a schematic configuration of the ultrasonic washer.

An ultrasonic washer 8 shown in FIG. 19 includes a washing tank 81 and an ultrasonic module 82, which is disposed, for example, in the bottom surface of the washing tank 81.

The ultrasonic module 82 includes the same ultrasonic unit 22 in each of the embodiments described above and a wiring substrate 83, which controls the ultrasonic unit 22. That is, the ultrasonic unit 22 includes the element substrate 41, the actuation surface 41B of which faces the interior of the washing tank 81, and the sealing plate 42, which is provided on the side facing the rear surface 41A of the element substrate 41, and further includes the ultrasonic transducer array 50 (not shown in FIG. 19), which is formed of the plurality of ultrasonic transducers 51 (not shown in FIG. 19) and provided on the side facing the rear surface 41A of the element substrate 41, and electrode lines drawn out of the array area Ar1 (not shown in FIG. 19) of the ultrasonic transducer array 50. The electrode lines are electrically connected, in the terminal areas Ar2 outside the array area Ar1, to wiring terminal sections (not shown) provided on the wiring substrate 83.

In the configuration described above, the ultrasonic unit 22 can be readily implemented on the wiring substrate 83 in the face-down implementation operation. Further, since the actuation surface 41B of the element substrate 41 faces the washing tank 81, waterproofness of the ultrasonic transducers 51 and the electrode wires provided on the side facing the rear surface 41A can be increased.

In each of the embodiments described above, the element substrate 41 is provided with the opening sections 411A. Instead, for example, the element substrate 41 may be provided with no opening sections 411A, but the ultrasonic transducers 51 may cause the element substrate 41 itself to vibrate and transmit an ultrasonic wave, and reception of an ultrasonic wave may be detected on the basis of vibration of the element substrate 41. In this case, the invention is also preferably applicable to a configuration in which a back plate as the array counter plate is disposed on the side opposite the ultrasonic wave transmitting surface of each of the ultrasonic transducers 51.

Further, the configuration in which the vibration films 412 are provided on one side of the opening sections 411A, specifically, the side facing the rear surface 41A has been illustrated. Instead, for example, the vibration films 412 may be provided on the other side of the opening sections 411A, specifically, the side facing the actuation surface 41B, and the piezoelectric elements 413, which form the ultrasonic transducers 51, may be provided on one side of the vibration film 412, specifically, the side facing the rear surface 41A.

In each of the embodiments described above, the vibration films 412 are provided on the side facing the rear surface 41A of the substrate main body section 411, which is provided with the opening sections 411A, but the configuration described above is not necessarily employed. For example, a plurality of recessed grooves corresponding to the ultrasonic transducers 51 may be provided in the actuation surface 41B of the substrate main body section 411, and the bottom surfaces of the recessed grooves may form the vibration films.

In each of the embodiments described above, each of the piezoelectric elements is formed of a laminate of a lower electrode, a piezoelectric film, and an upper electrode layered on each other in the thickness direction by way of example, but the configuration described above is not necessarily employed. For example, a pair of electrodes facing each other may be disposed on a piezoelectric film, specifically, one surface thereof perpendicular to the thickness direction. The electrodes may instead be so disposed as to sandwich the piezoelectric film, specifically, side surfaces thereof extending along the thickness direction.

In addition, the specific structure employed when the invention is implemented may be an appropriate combination of the embodiments and the variations described above or may be changed as appropriate to any other structure in actual implementation of the invention to the extent that the advantage of the invention is achieved.

The entire disclosure of Japanese Patent Application No. 2015-150079 filed on Jul. 29, 2015 is expressly incorporated by reference herein.

What is claimed is:

1. An ultrasonic device comprising:
    an element substrate provided with an ultrasonic transducer array in which a plurality of ultrasonic transducers are arranged in an array;
    an array counter plate that is bonded to the element substrate and covers at least the ultrasonic transducer array; and
    a support substrate that supports at least one of the element substrate and the array counter plate,
    wherein the support substrate has an insertion section into which at least part of the array counter plate is inserted.

2. The ultrasonic device according to claim 1, further comprising
    a fixing member that fixes the array counter plate to the support substrate.

3. The ultrasonic device according to claim 1,
    wherein the insertion section is a first groove section provided in a thickness direction of the support substrate, and
    the first groove section has a first bottom surface that comes into contact with a surface of the array counter plate, the surface facing a side opposite the element substrate.

4. The ultrasonic device according to claim 1,
    wherein the insertion section is a through hole that passes through the support substrate in a thickness direction.

5. The ultrasonic device according to claim 4, further comprising
    a reinforcing plate that covers the through hole and is bonded to the support substrate,
    wherein a surface of the reinforcing plate, the surface facing the through hole, comes into contact with a surface of the array counter plate, the surface facing a side opposite the element substrate.

6. The ultrasonic device according to claim 5,
    wherein the reinforcing plate has a second groove section which is located in a position where the reinforcing plate overlaps with the array counter plate in a plan view of the reinforcing plate viewed in a thickness direction thereof and into which an end section of the array counter plate, the end section facing the side opposite the element substrate, is inserted, and
    the second groove section has a second bottom surface that comes into contact with the surface of the array counter plate on the side opposite the element substrate.

7. The ultrasonic device according to claim 1,
    wherein the element substrate has a protruding section that protrudes beyond the array counter plate and the insertion section in a plan view viewed along a substrate thickness direction, and
    the protruding section is bonded to the support substrate.

8. The ultrasonic device according to claim 7, further comprising
    bonding members that bond the element substrate to the support substrate,
    wherein the element substrate has a first surface and a second surface facing away from the first surface,
    the ultrasonic transducer array is provided on the first surface,
    the array counter plate is bonded to the first surface,
    the first surface of the protruding section of the element substrate has element terminal sections electrically connected to the ultrasonic transducers,
    the support substrate has circuit terminal sections provided in positions facing the element terminal sections and electrically bonded to the element terminal sections, and
    the bonding members are made of an electrically conductive material and electrically bond the element terminal sections to the circuit terminal sections.

9. The ultrasonic device according to claim 1,
    wherein the element substrate has opening sections corresponding to the plurality of ultrasonic transducers and vibration films that close the opening sections, and
    the array counter plate has recessed sections provided in positions where the recessed sections overlap with the vibration films corresponding to the ultrasonic transducers in a plan view viewed in a thickness direction of the element substrate and barrier sections that separate the recessed sections from each other and support the element substrate in regions between the plurality of ultrasonic transducers and other than the vibration films.

10. The ultrasonic device according to claim 1,
    wherein the element substrate has opening sections corresponding to the plurality of ultrasonic transducers and vibration films that close the opening sections,
    the ultrasonic transducer array has ultrasonic transducer groups each including a plurality of the ultrasonic transducers driven with a single drive signal and arranged adjacent to each other, and
    the array counter plate has recessed sections open toward the element substrate and provided in positions where the recessed sections overlap with the vibration films corresponding to the ultrasonic transducers, which are contained in the plurality of ultrasonic transducer groups, in a plan view viewed in a thickness direction of the element substrate and barrier sections that separate the recessed sections from each other and support the element substrate in regions between the plurality of ultrasonic transducer groups and other than the vibration films.

11. A piezoelectric device comprising:
an element substrate provided with a piezoelectric element array in which a plurality of piezoelectric elements are arranged in an array;
an array counter plate that is bonded to the element substrate and covers at least the piezoelectric element array; and
a support substrate that supports at least one of the element substrate and the array counter plate,
wherein the support substrate has an insertion section into which at least part of the array counter plate is inserted.

12. An ultrasonic measurement apparatus comprising:
an element substrate provided with an ultrasonic transducer array in which a plurality of ultrasonic transducers are arranged in an array;
an array counter plate that is bonded to the element substrate and covers at least the ultrasonic transducer array;
a support substrate that supports at least one of the element substrate and the array counter plate; and
a control section that controls the ultrasonic transducers,
wherein the support substrate has an insertion section into which at least part of the array counter plate is inserted.

13. An electronic instrument comprising:
The piezoelectric device according to claim 11; and
a control section that controls the piezoelectric elements.

* * * * *